United States Patent
Hsieh et al.

(10) Patent No.: US 12,216,412 B2
(45) Date of Patent: *Feb. 4, 2025

(54) FREQUENCY-PICKED METHODOLOGY FOR DIFFRACTION-BASED OVERLAY MEASUREMENT

(71) Applicant: Taiwan Semiconductor Manufacturing Company, Ltd., Hsinchu (TW)

(72) Inventors: Hung-Chih Hsieh, Miaoli County (TW); Ming-Hsiao Weng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/517,653

(22) Filed: Nov. 22, 2023

(65) Prior Publication Data

US 2024/0085804 A1    Mar. 14, 2024

Related U.S. Application Data

(63) Continuation of application No. 17/132,871, filed on Dec. 23, 2020, now Pat. No. 11,852,981.

(Continued)

(51) Int. Cl.
*G03F 7/00* (2006.01)
*H01L 21/66* (2006.01)

(52) U.S. Cl.
CPC ...... *G03F 7/70633* (2013.01); *G03F 7/70625* (2013.01); *H01L 22/12* (2013.01)

(58) Field of Classification Search
CPC ............. G03F 7/70625; G03F 7/70633; G03F 7/70683; G03F 9/7076; G03F 9/708;

(Continued)

(56) References Cited

U.S. PATENT DOCUMENTS 10,990,023 B1    4/2021  Hsieh et al.
11,852,981 B2 *  12/2023 Hsieh ............... H01L 22/12
(Continued)

FOREIGN PATENT DOCUMENTS

TW          201830160 A      8/2018

OTHER PUBLICATIONS

Notice of Allowance issued in U.S. Appl. No. 17/132,871, dated Sep. 8, 2023.

*Primary Examiner* — Peter B Kim
(74) *Attorney, Agent, or Firm* — STUDEBAKER & BRACKETT PC

(57) ABSTRACT

An overlay error measurement method includes disposing a lower-layer pattern over a substrate that includes disposing a first pattern having a first plurality of first sub-patterns extending in a first interval along a first direction and being arranged with a first pitch in a second direction crossing the first direction. The method includes disposing a second pattern having a second plurality of second sub-patterns extending in a second interval along the first direction and being arranged with a second pitch, smaller than the first pitch, in the second direction crossing the first direction. The second sub-patterns are disposed interleaved between the first sub-patterns. The method includes disposing an upper-layer pattern including a third pattern having the first pitch and at least partially overlapping with the lower-layer pattern over the lower-layer pattern and determining an overlay error between the lower-layer pattern and the upper-layer pattern.

20 Claims, 14 Drawing Sheets

Related U.S. Application Data

(60) Provisional application No. 62/982,721, filed on Feb. 27, 2020.

(58) Field of Classification Search
CPC ......... H01L 22/12; H01L 22/10; H01L 22/20; H01L 22/30
See application file for complete search history.

(56) References Cited

U.S. PATENT DOCUMENTS

| | | |
|---|---|---|
| 2008/0311344 A1 | 12/2008 | Marie Kiers et al. |
| 2010/0328655 A1 | 12/2010 | Den Boef |
| 2019/0354024 A1 | 11/2019 | Tsiatmas et al. |
| 2021/0200106 A1* | 7/2021 | Levinski ................. G02B 27/60 |
| 2023/0359135 A1* | 11/2023 | Hsieh .................... H01L 23/544 |

* cited by examiner

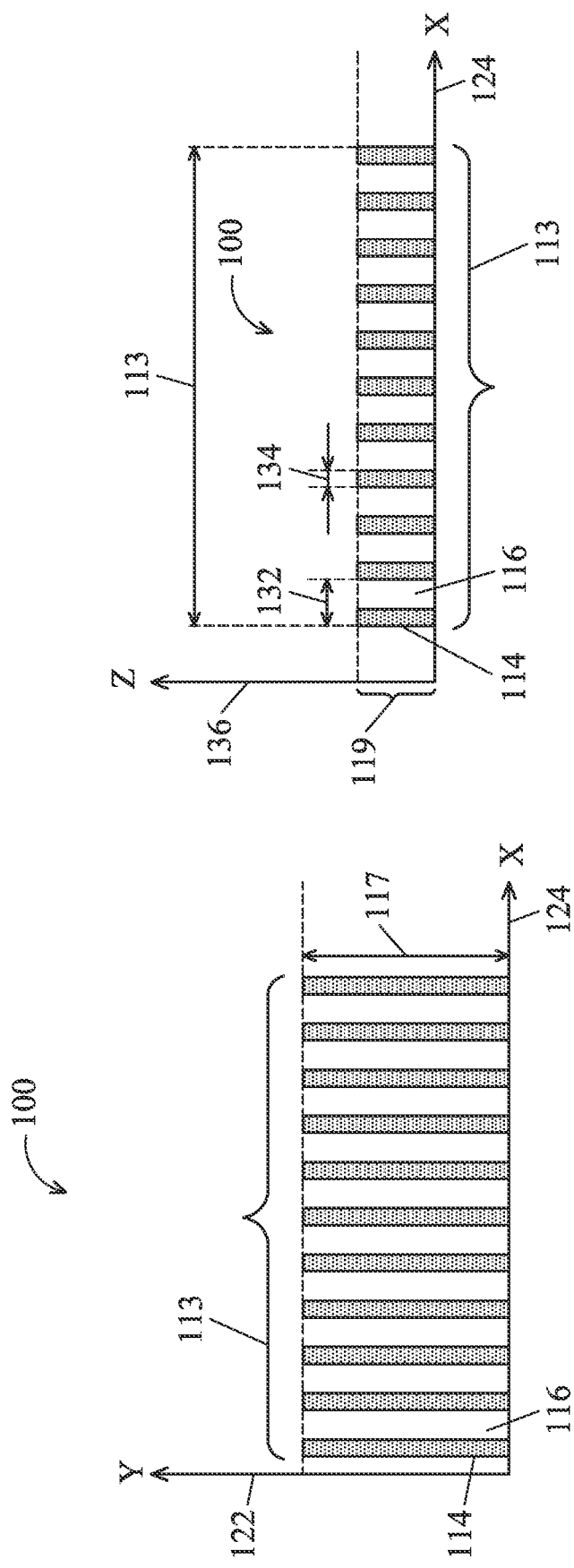

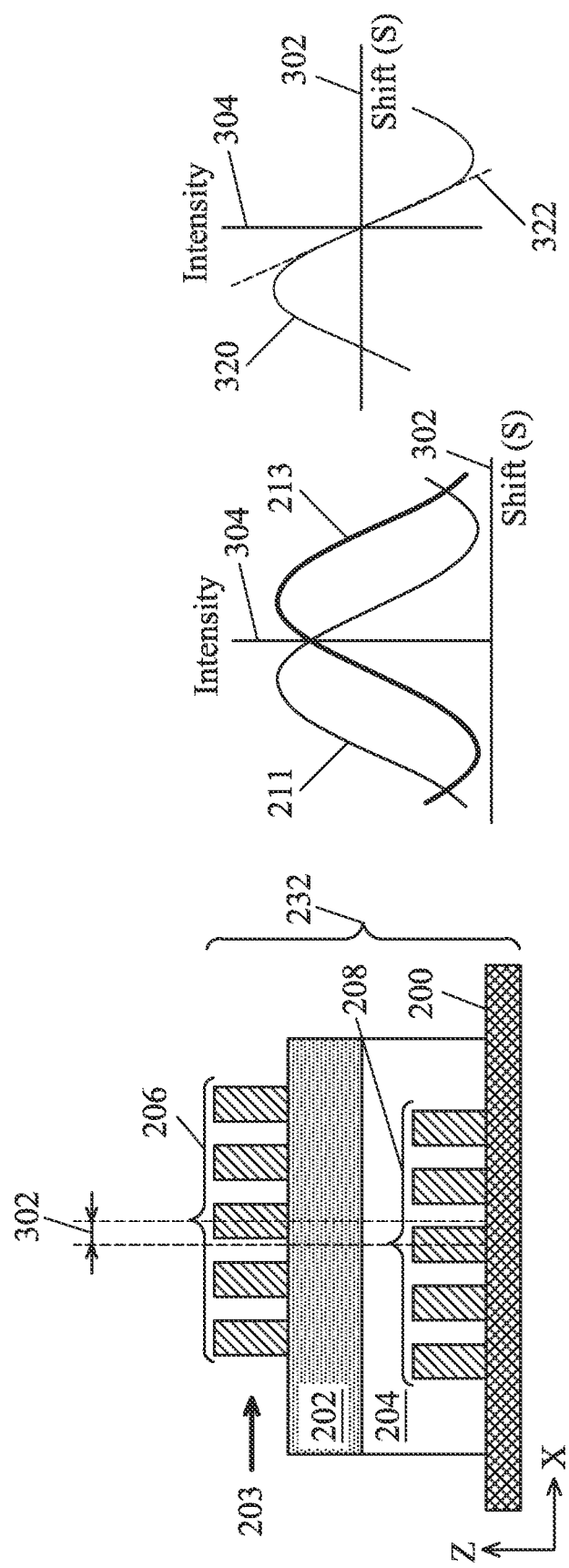

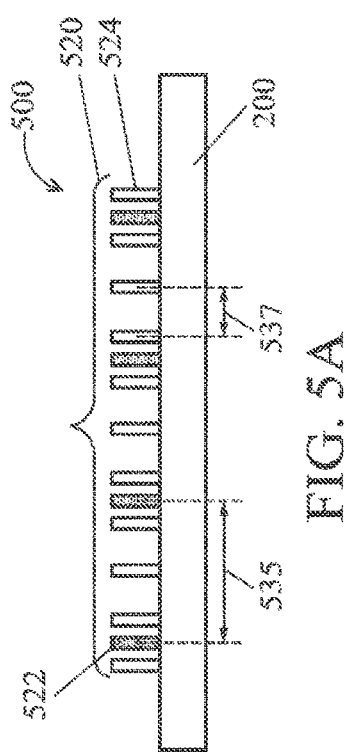
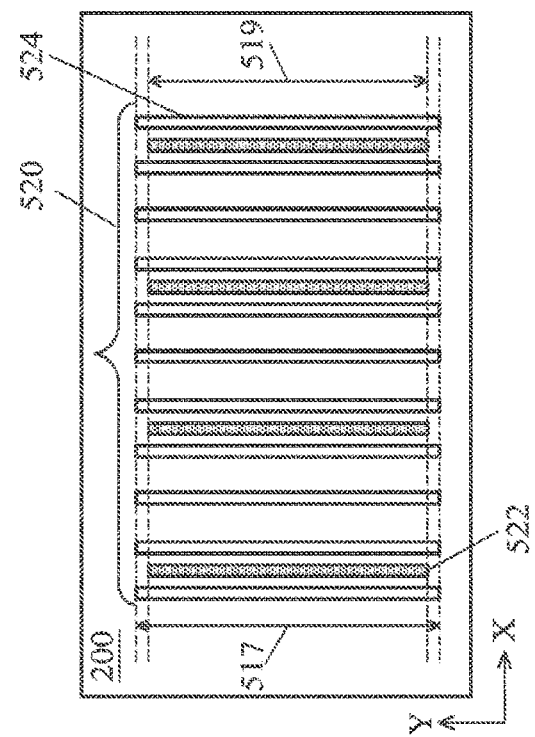
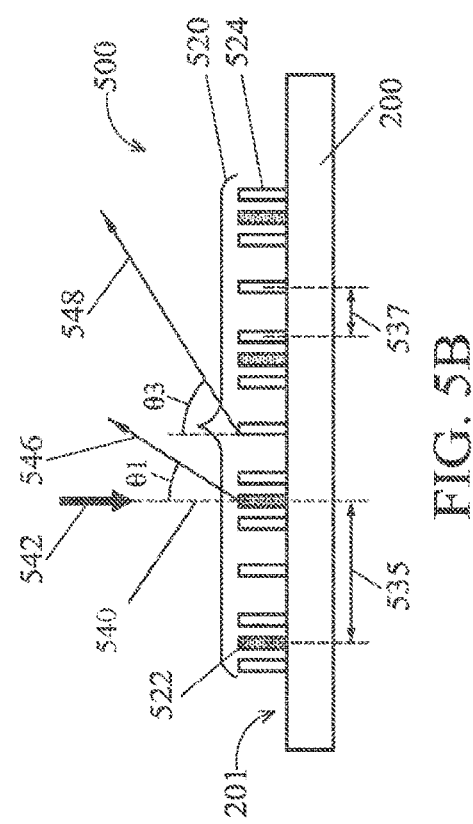
FIG. 5A
FIG. 5B
FIG. 5D

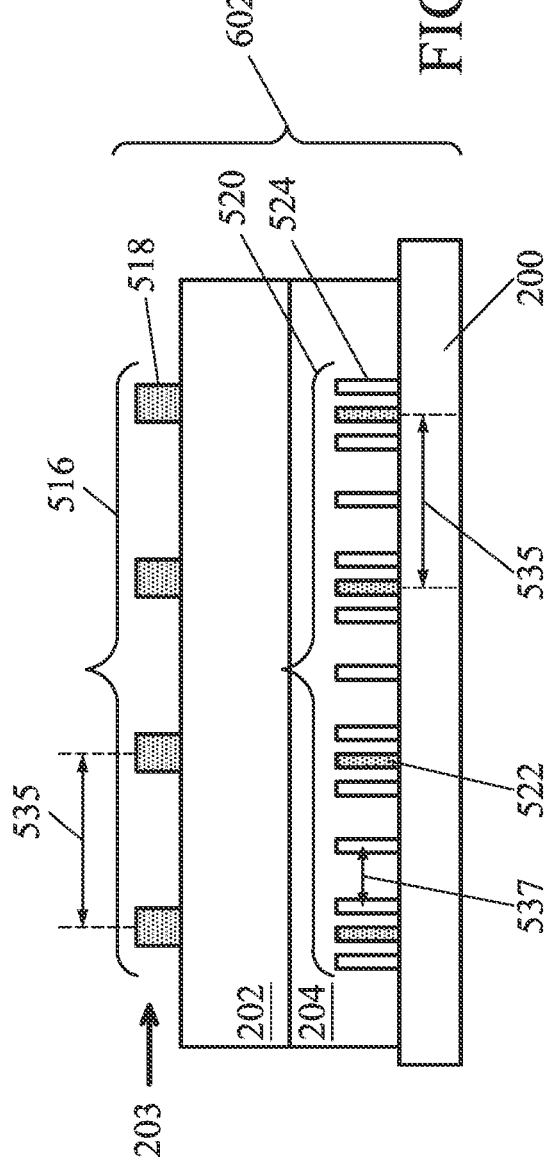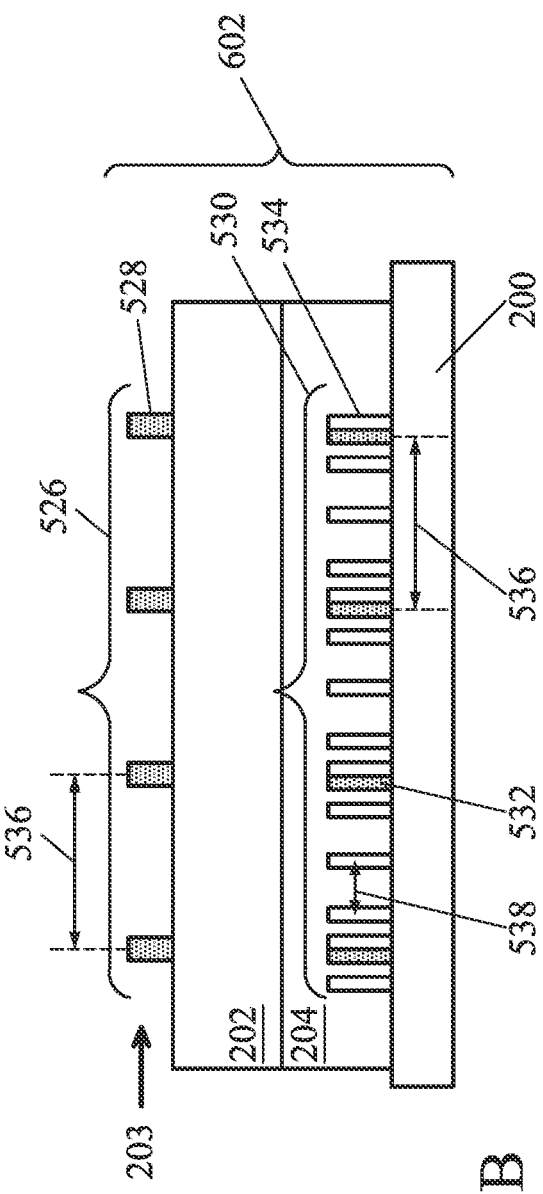

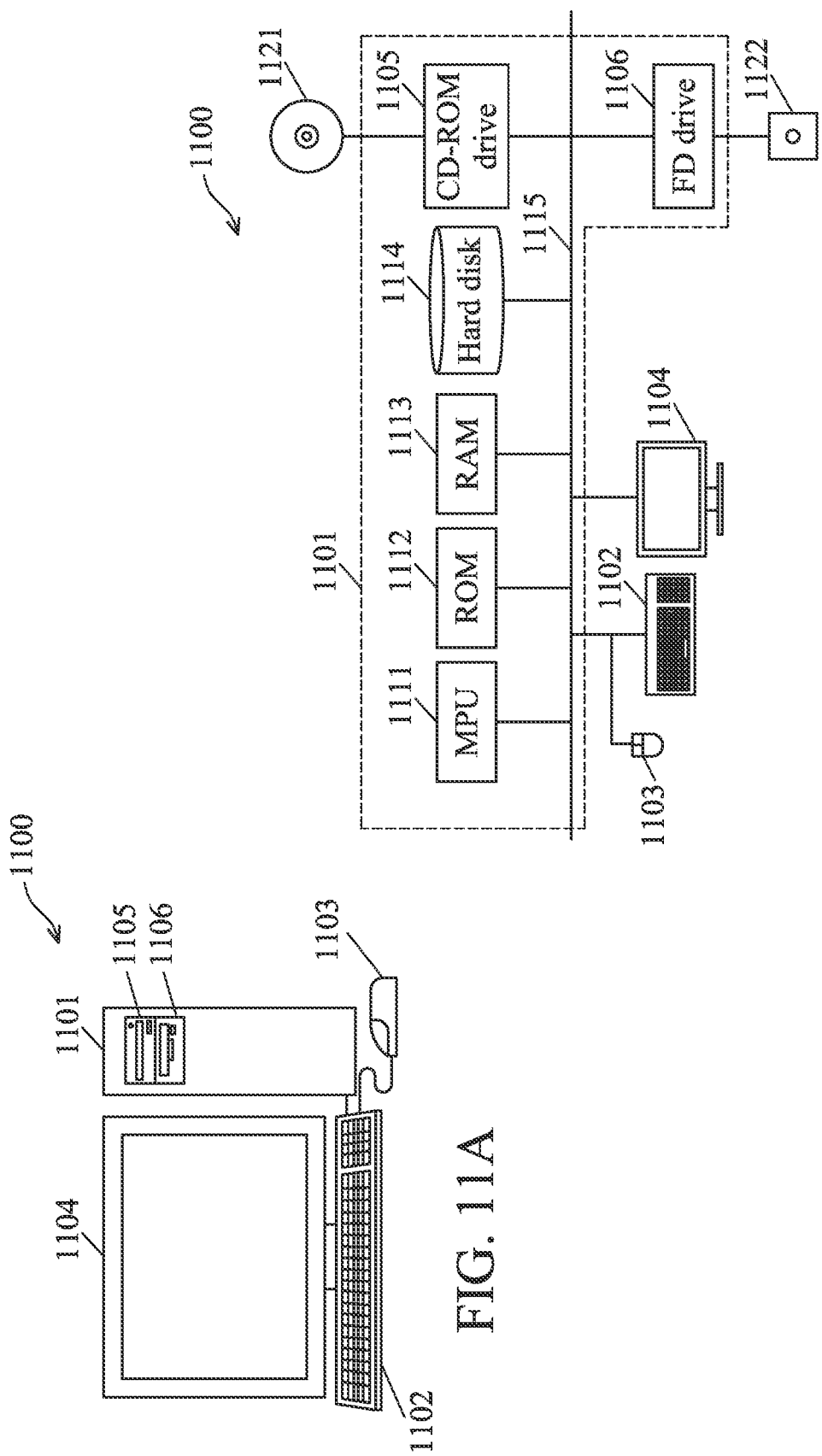

FREQUENCY-PICKED METHODOLOGY FOR DIFFRACTION-BASED OVERLAY MEASUREMENT

PRIORITY CLAIM AND CROSS-REFERENCE

This application is a continuation application of U.S. application Ser. No. 17/132,871 filed on Dec. 23, 2020, now U.S. Pat. No. 11,852,981, entitled "Frequency-picked Methodology for Diffraction-based Overlay Measurement," which claims priority to U.S. Provisional Application No. 62/982,721 filed on Feb. 27, 2020, entitled "Frequency-picked Methodology for Diffraction-based Overlay Measurement," the entire disclosures of each of which are incorporated herein by reference.

BACKGROUND

As the semiconductor industry in pursuit of higher device density, has progressed into nanometer technology process nodes, reducing overlay errors of a photo resist layout pattern and an underlying layout pattern in a lithography operation has become one of the important issues. Therefore, an efficient method of precisely determining an overlay error between different photo resist layout patterns and one of the underlying layout patterns is desirable.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B respectively illustrate a top view and a cross-sectional view of an overlay measurement pattern to be generated by a light beam lithography system on a wafer.

FIGS. 3A, 3B and 3C respectively illustrate a substrate having two overlay measurement patterns having an overlay shift (drift), positive and negative first order diffracted light intensities as a function of the overlay shift, and a difference of the first order diffracted light intensities as a function of the overlay shift.

FIGS. 5A, 5B, 5C, and 5D respectively illustrate an overlay measurement pattern having a combination of two measurement patterns with different pitches on a substrate, an incident light beam and first order diffractions reflected from the combination of the two measurement patterns on the substrate, a graph of intensity/amplitude of the diffracted light from the substrate, and a top view of the overlay measurement pattern in accordance with some embodiments of the present disclosure.

FIGS. 6A and 6B respectively illustrate cross-sectional views of a substrate having an underlying substrate, a first layer on top of the underlying substrate having a combination of two measurement patterns, a second layer on top of the first layer, and another measurement pattern over the second layer in accordance with some embodiments of the present disclosure.

FIGS. 7B and 7C illustrate graphs of intensity/amplitude of the diffracted light from the substrates in accordance with some embodiments of the present disclosure.

FIGS. 11A and 11B illustrate an apparatus for determining an overlay error in accordance with some embodiments of the disclosure.

DETAILED DESCRIPTION

Figures 2A, 2B:
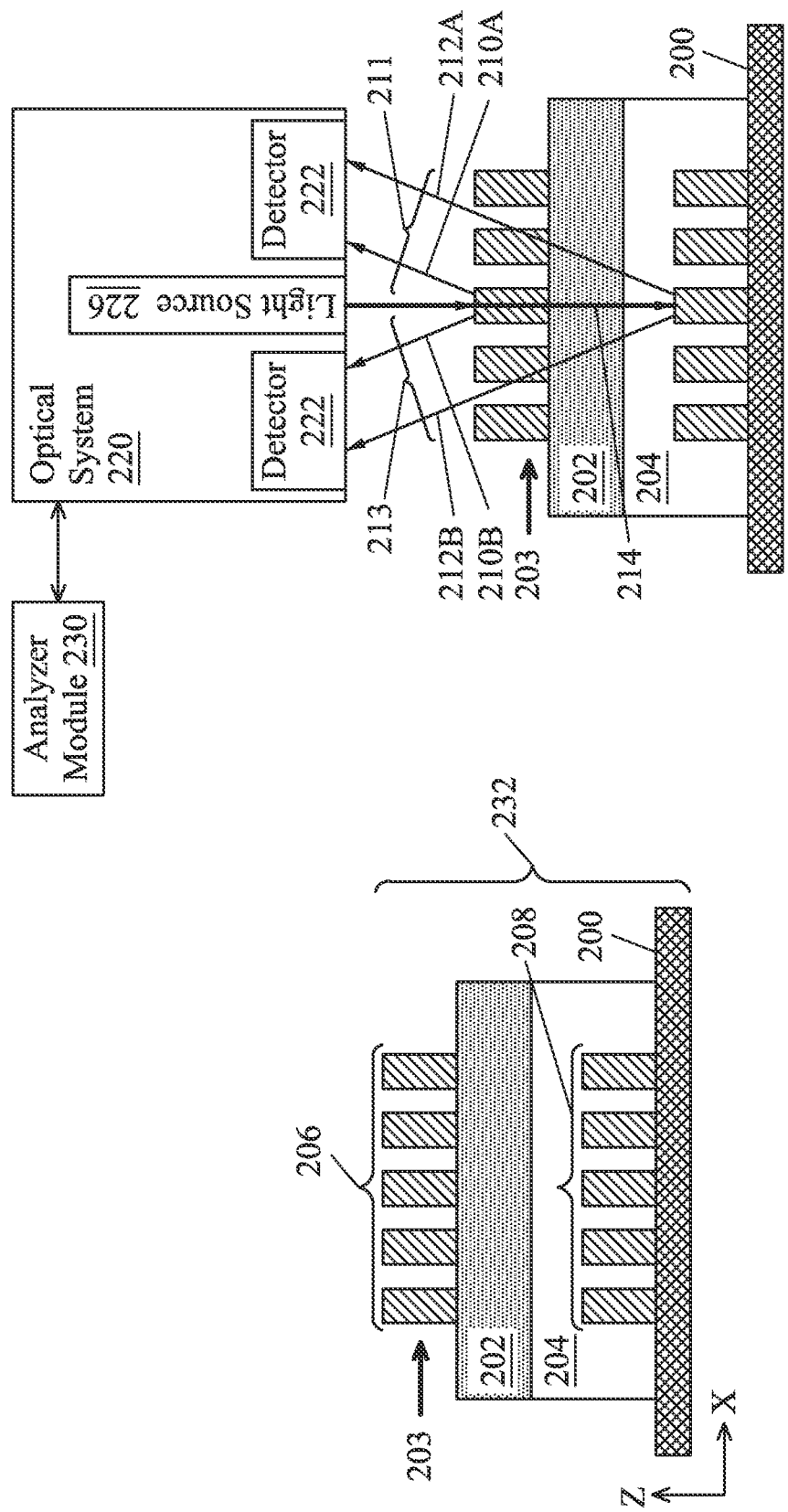
FIGS. 2A and 2B respectively illustrate cross-sectional views of a substrate having two overlay measurement patterns and FIG. 2B includes an optical system for determining an overlay error between the two overlay measurement patterns of the substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

During an integrated circuit (IC) design, a number of layout patterns of the IC, for different steps of IC processing, are generated. The layout patterns include geometric shapes corresponding to structures to be fabricated on a wafer. The layout patterns may be photo mask layout patterns that are projected, e.g., imaged, on the wafer to create the IC. A lithography process transfers a layout pattern of a photo mask to the wafer such that etching, implantation, or other steps are applied only to predefined regions of the wafer.

Multiple layout patterns may be transferred to different layers of the wafer to create the different structures on the wafer. Thus, a second or subsequent layout pattern may be transferred to a second layer on the wafer when a first or previous layout pattern exists in a different first layer of the wafer beneath the second layer.

As described, multiple layout patterns may be transferred to different layers of the wafer to create the different structures on the wafer. It is desirable that there is no overlay error between the layout patterns that are produced on a wafer. In some embodiments, an overlay measurement pattern, e.g., a grating, is included in each layout pattern. The overlay measurement pattern, which may not be part of the functional IC circuit, is used for determining the overlay error between different layout patterns that are disposed on the wafer. In some embodiments, the overlay error between two layout patterns of a wafer is measured when the overlay measurement patterns of the two layout patterns overlap. The overlapped overlay measurement patterns of the two layout patterns are irradiated with a beam of light, e.g., a coherent beam of light, and the overlay error between two layout patterns is determined, e.g., calculated, based on diffracted light that is reflected back from the overlapped overlay measurement patterns of the two layout patterns.

In some embodiments, a first layout pattern that includes a first overlay measurement pattern is imaged, e.g., projected, onto a wafer to create the first layout pattern and the first overlay measurement pattern in a first layer on the wafer. In some embodiments, the first layer is covered with a second layer and a second layout pattern that includes a second overlay measurement pattern is created in the second layer. The second layer is initially covered with a resist material layer and the second layout pattern that includes the second overlay measurement pattern is imaged onto the resist material layer on top of the second layer. Therefore, the second overlay measurement pattern is in the resist material layer and the resist material layer is on top of the second layer that is on top of the first layer while the first layer includes the first overlay measurement pattern. After the resist material is developed, the first overlay measurement pattern of the first layer is under the second overlay measurement pattern of the resist material layer. Thus, the overlay error between the first layout pattern and the second layout pattern is measured. In some embodiments, when the overlay error is below a threshold, the developed resist material that includes the second layout pattern is used in the next processing step, for example, an etching process. Otherwise, the resist material is removed and a new resist layout pattern is formed with corrected alignment of the lithography process.

As noted, the overlay error may be measured when the first overlay measurement pattern of the first layer and the second overlay measurement pattern of the resist material layer overlap. In some embodiments, each one of the layout patterns includes a plurality of overlay measurement patterns to make sure overlap happens in at least one location that produces a strong diffracted light that is reflected back from the overlapped overlay measurement patterns.

As noted, the overlay error between two layout patterns is determined based on diffracted light that is reflected back from the overlapped overlay measurement patterns of the two layout patterns. In some embodiments, the two overlapped overlay measurement patterns have the same pitch and the overlay error is measured based on the first order diffracted light that is reflected from the two overlapped overlay measurement patterns. The first order diffracted light emerges from the two overlapped overlay measurement patterns at an angle with respect to a perpendicular surface to the first layer and the resist material layer. The angle of the diffracted light is inversely proportional to the pitch of the two overlapped overlay measurement patterns. The first order diffracted light is detected by the detectors of an optical system. In some embodiments, a numerical aperture of the optical system, e.g., the numerical aperture of the detectors of the optical system is limited such that the first order diffracted light enters the optical system but higher order diffracted light does not enter the optical system.

As described, the pitch size of the two overlapped overlay measurement patterns that is used for overlay error measurement is selected such that at least the first order diffracted light has an angle with the perpendicular surface to the first layer and the resist material layer such that the first order diffracted light may enter the optical system. As the semiconductor industry in pursuit of higher device density, has progressed into nanometer technology process nodes, the pitch size of the two overlapped overlay measurement patterns may become much larger than the sizes and distance of the layout patterns that are produced in the first layer and the resist material layer. The first layer, including the overlay measurement pattern produced in the first layer may go under different process steps before the overlay measurement pattern is produced in the resist material layer over the first layer. Thus, the pitch size of the overlay measurement pattern of the first layer may be distorted and the gratings of the first layer, e.g., the bottom layer, may be affected and asymmetry may be created in the bottom grating profile because of going under different process steps. The distortion of the pitch size of the overlay measurement pattern of the first layer may generate a change, e.g., a bottom grating asymmetry signal, in the signals detected by the detectors. The bottom grating asymmetry signal may affect the accuracy of the overlay error measurement.

In some embodiments, the manufacturing process steps are designed to avoid affecting the sizes and distance, e.g., critical dimensions (CD) of the layout pattern of the layers. However, in some embodiments, the pitch size of the overlay measurement pattern of the layer is much different, e.g., is much larger, than the CD of the layout pattern of the first layer. The process steps for manufacturing a semiconductor device are designed to avoid affecting the CD of the semiconductor device, however, the process steps may distort the larger pitch size of the overlay measurement pattern of the first layer. For example, the shape of the overlay measurement pattern becomes asymmetric, which may cause gross error in the overlay error measurement. In another case, the location of the large overlay measurement patterns shifts relative to the fine circuit patterns due to size dependency of lens distortion of the optical lithography tool. Thus, extra features, e.g., one or more extra overlay measurement patterns, are added to the overlay measurement pattern of the first layer such that the pitch size is reduced together with reduction of line width, and becomes comparable with the sizes and distance of the layout pattern of the first layer and at the same time the extra features, e.g., additional gratings, do not affect the first order diffracted light that is used for overlay error measurement. In some embodiments, the extra features protect the overlay measurement pattern of the first layer from process effects.

FIGS. 1A and 1B respectively illustrate a top view and a cross-sectional view of an overlay measurement pattern to be generated by a light beam lithography system on a wafer. FIG. 1A shows an overlay measurement pattern 100 that is extended in an interval 117 in a Y-direction 122 and is distributed in an X-direction 124 in an extent 113. The overlay measurement pattern 100 includes dark strips 114 and bright strips 116. In some embodiments, dark strips 114 are low reflectance portions and the bright strips 116 are high reflectance portions when an incident light beam radiates the overlay measurement pattern 100. In some embodiments, the alternating dark strips 114 and the bright strips 116 generate a grating of an overlay measurement pattern that is described below with respect to FIGS. 5A, 5B, 5D, 6A, 6C, 7A, and 8.

Figure 7A:
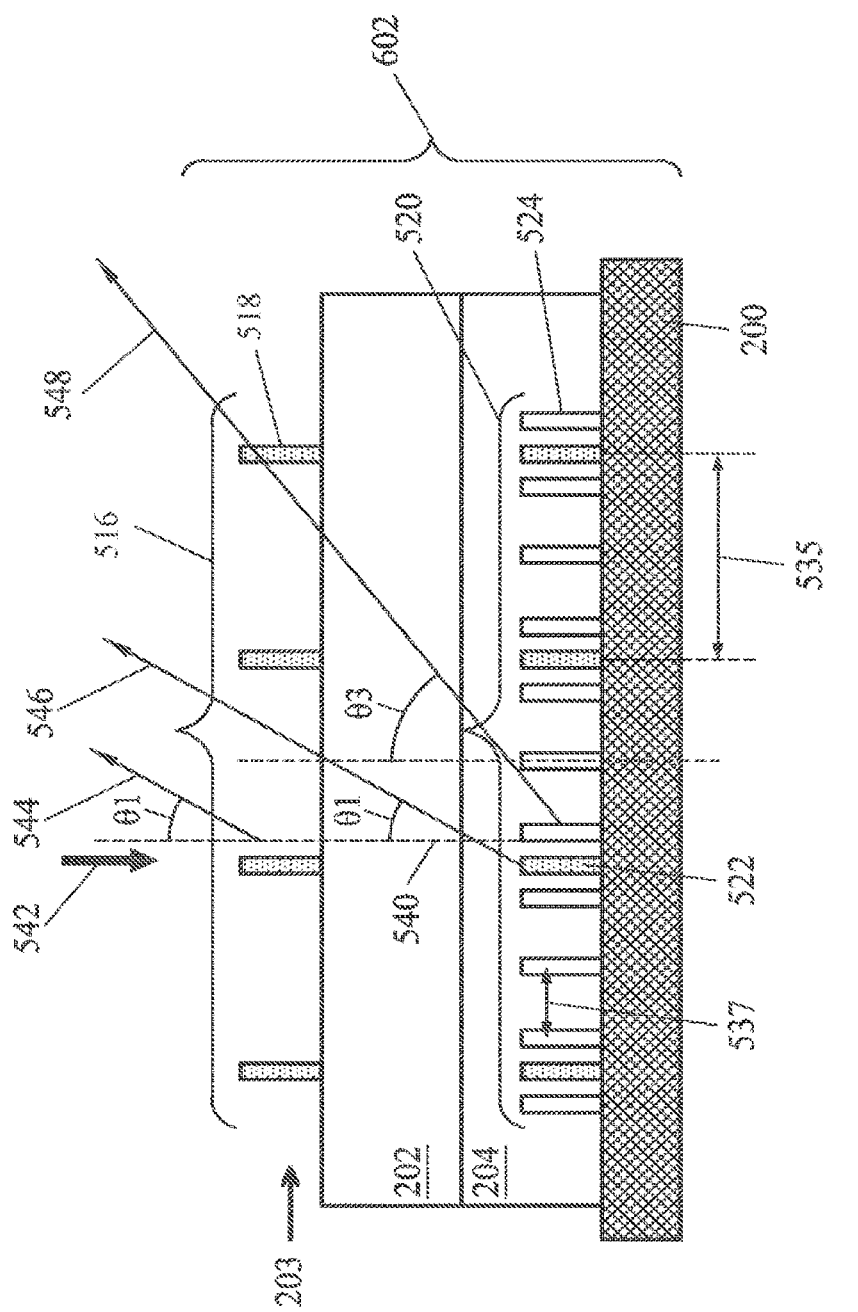
FIGS. 7A, 7B, and 7C respectively illustrate the substrates of FIG. 6A with an incident light beam directed to a surface of the substrates and first order diffractions reflected from the substrates.
Figure 8:
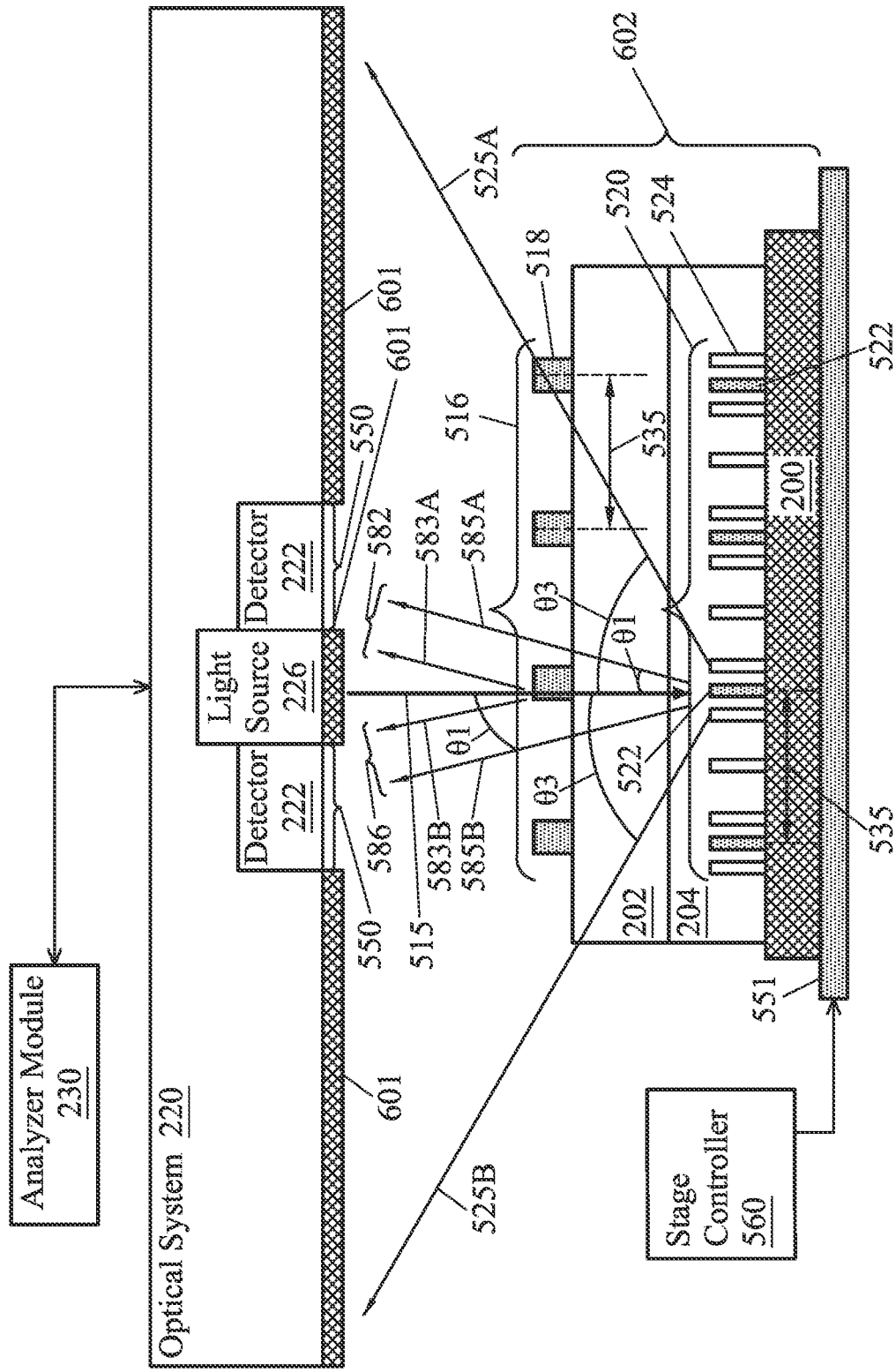
FIG. 8 illustrates a measurement system for determining an overlay error in accordance with some embodiments of the disclosure.

FIG. 1B shows a cross-sectional view of the overlay measurement pattern 100 that is extended in a Z-direction 136 with a height 119 and is distributed in the X-direction 124 in the extent 113 and, thus, the alternating dark strips 114 and the bright strips 116 are three-dimensional boxes. In some embodiments, the dark strips 114 are the features of a layer (e.g., a photo resist pattern) that are remained after a lithography process is applied and the bright strips 116 are the locations that are removed after the lithography process is applied. In other embodiments, the role of the dark patterns and the bright patterns are reversed depending, for example, on a material of the underlying layer. As shown in the cross-sectional view, the dark strips 114 have a width 134, e.g., critical dimension (CD), and the overlay measurement pattern 100 has a pitch 132. In some embodiments, the dark strips 114 and the bright strips 116 have the same width 134 and, thus, the pitch 132 is twice the width 134. In some embodiments, as shown in FIGS. 5B, 7A, and 8, when a wavelength of the incident light beam is comparable with the width 134 and/or the pitch 132 of the overlay measurement pattern, the incident light beam is diffracted and a portion of the incident light beam is reflected back. The diffraction of the incident light beam is described with respect to FIG. 2B.

Figure 4:
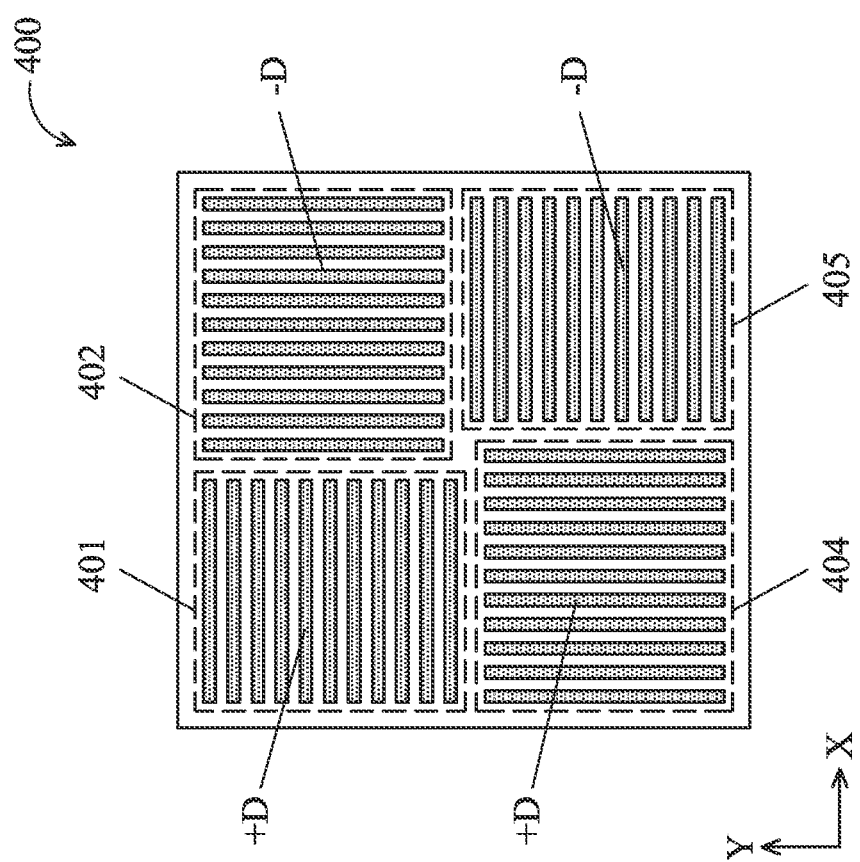
FIG. 4 illustrates an exemplary overlay measurement pattern.

FIGS. 2A and 2B respectively illustrate cross-sectional views of a substrate 232 having two overlay measurement patterns 206 and 208. FIG. 2B includes an optical system 220 for determining an overlay error between the two overlay measurement patterns of the substrate. FIG. 2A includes a cross-sectional view of the overlay measurement pattern 208 in a first layer 204 that is disposed on top of an underlying substrate 200. In some embodiments, the overlay measurement pattern 208 along with a corresponding circuit layout pattern (not shown) is initially disposed on the underlying substrate 200 and then the first layer 204 is disposed, e.g., epitaxially grown or deposited, over the overlay measurement pattern 208. In some embodiments, a second layer 202 is disposed, e.g., epitaxially grown or deposited, over the first layer 204. In some embodiments, a resist material layer 203 is deposited over the second layer 202 and the resist material layer 203 is exposed and developed to produce an overlay measurement pattern 206 along with a corresponding layout pattern (not shown) in the resist material layer 203. In some embodiments, the overlay measurement patterns 206 and 208 are consistent with the overlay measurement patterns of FIGS. 1A, 1B, 5A, 5B, 5D, 6A, 6C, 7A, and 8. Also, consistent with FIGS. 1A and 1B, the overlay measurement patterns 206 and 208 are distributed in the X-direction to measure an overlay error in the X-direction. In some embodiments, as shown in FIG. 4, overlay measurement patterns are also distributed in the Y-direction to measure an overlay error in the Y-direction. In some embodiments, the second layer 202 does not exist and the overlay measurement pattern 206 is disposed on top of the first layer 204.

FIG. 2B shows an optical system 220 that includes one or more light sources 226 and one or more detectors 222. FIG. 2A further shows the overlay measurement patterns 206 and 208, the first layer 204, the second layer 202, and the resist material layer 203. In some embodiments the light source 226 of the optical system 220 transmits, e.g., radiates, an incident light beam 214 to the overlay measurement patterns 206 and 208, which have an overlap in the X-direction and in the Y-direction. In some embodiments, the overlay measurement patterns 206 and 208 have a same pitch and the light source 226, which is a coherent light source, has a wavelength comparable to the pitch of the overlay measurement patterns 206 and 208. A portion of the incident light beam 214 is diffracted and reflected from the overlay measurement pattern 206 and produces the negative and positive first order diffractions 210A and 210B respectively. A remaining portion of the incident light beam 214 passes through the overlay measurement pattern 206 and the second layer 202 and is diffracted and reflected from the overlay measurement pattern 208 and produces the negative and positive first order diffractions 212A and 212B respectively. Thus, the negative first order diffractions 211 that includes the negative first order diffractions 210A and 212A that are reflected are detected by a detector 222 and the positive first order diffractions 213 that includes the positive first order diffractions 210B and 212B that are reflected are detected by another detector 222.

An analyzer module 230 shown in FIG. 2B is coupled to the optical system 220. The analyzer module 230 receives corresponding signals of the detected negative and positive first order diffractions 211 and 213 and performs an analysis on the corresponding signals to determine a drift, e.g., a shift, between the overlay measurement patterns 208 and 206.

In some embodiments, the first layer 204 includes the overlay measurement pattern 208 as a portion of a first layout pattern. Also, the resist material layer 203 that is deposited on the second layer 202 includes the overlay measurement pattern 206 as a portion of the second layout pattern. Thus, the lateral positional difference between the overlay measurement patterns 208 and 206 indicates the lateral positional difference between the first layout pattern of the first layer 204 and the second layout pattern to be created in the second layer 202 using the resist material layer 203. In some embodiments, the top overlay measurement pattern 206 and the bottom overlay measurement pattern 208 have the same pitch and the same shape such that the number of boxes (e.g., sub-patterns of the overlay measurement pattern), the width of the boxes, and the distance between the boxes in the overlay measurement patterns 206 and 208 are the same. In some embodiments, the top overlay measurement pattern 206 and the bottom overlay measurement pattern 208 coincide such that the boxes in the overlay measurement patterns 206 and 208 coincide and there is no drift between the boxes of the top overlay measurement pattern 206 and the boxes of the bottom overlay measurement pattern 208. In some embodiments, due to the numerical aperture of the optical system 220, e.g., due to the numerical aperture of the detectors 222, the negative and positive first order diffractions 211 and 213 enter the detectors and the higher order diffractions do not enter the detectors and, thus, do not enter the optical system 220. In some embodiments, the overlay measurement patterns 206 and 208 are consistent with the overlay measurement patterns of FIGS. 6A, 6B, 7A, and 8.

FIGS. 3A, 3B and 3C respectively illustrate a substrate 232 having two overlay measurement patterns 206 and 208 having an overlay shift (FIG. 3A), negative and positive first order diffractions 210A and 210B as a function of the overlay shift (FIG. 3B), and a difference of the first order diffracted light intensities as a function of an overlay shift distance 302 (FIG. 3C). FIG. 3A is consistent with FIG. 2A with a difference that the overlay measurement pattern 206 of the resist material layer 203 on top of the second layer 202 is shifted with respect to the overlay measurement pattern 208 by the overlay shift distance 302 in the positive X-direction. The overlay shift distance 302 is a distance between the center (e.g., the center of mass or the center of the center pattern) of the two overlay measurement patterns 206 and 208.

FIG. 3B shows light intensities of the negative and positive first order diffractions 211 and 213 as a function of the overlay shift distance 302. In some embodiments, FIG. 3B respectively shows the signals corresponding to the negative and positive detected first order diffractions 211 and 213 that are detected by the detectors 222 of the optical system 220 of FIG. 2B. In some embodiments, the analyzer module 230 receives corresponding signals of detected negative and positive first order diffractions 211 and 213 and subtracts the signal corresponding to the negative first order diffractions 211 from the signal corresponding to the positive first order diffractions 213 to generate an asymmetry (AS) function 320 (FIG. 3C). As shown in FIG. 3B, the signal corresponding to the negative first order diffractions 211 has an intensity peak in the negative region of the overlay shift distance 302 and the signal corresponding to the positive first order diffractions 213 has an intensity peak in the positive region of the overlay shift distance 302. Also, FIG. 3B shows that the signals corresponding to the detected negative and positive first order diffractions 211 and 213 are symmetric with respect to the intensity coordinate 304. Although the overlay shift distance 302 is displayed as the shift between the edges of the boxes of the overlay measurement patterns 206 and 208, the origin of the overlay measurement patterns 206 and 208 may be defined as the center of the overlay measurement patterns 206 and 208 and the overlay shift distance 302 can be defined with respect to a shift in the center of the overlay measurement patterns 206 and 208. In some embodiments, the signals corresponding to the negative first order diffraction 211 and the positive first order diffraction 213 are consistent with the signals that are detected by the detectors 222 of FIG. 8.

FIG. 3C shows the AS function 320 as a function of the overlay shift distance 302. Because the signals corresponding to the detected negative and positive first order diffractions 211 and 213 are symmetric with respect to the intensity coordinate 304, the AS function 320 passes through the origin. In some embodiments, the AS function may be written as equation (1):

$$AS = k \cdot \sin\left[\left(\frac{2\pi}{P}\right) \cdot (S)\right] \quad \text{Eq. (1)}$$

where P is a pattern (grating) pitch, S is the overlay shift distance 302, and k is determined based on the light wavelength and a layer structure (e.g., thickness, refractive index, and absorption coefficient) of the first layer, the second layer, and the resist material layer. In some embodiments, when the overlay shift distance 302 is small compared to the pattern pitch P, the AS function may be written as equation (2):

$$AS = k \cdot \left(\frac{2\pi}{P}\right) \cdot (S) \quad \text{Eq. (2)}$$

where $$K = k \cdot \left(\frac{2\pi}{P}\right)$$

is the slope 322 of the AS function 320 at the origin in FIG. 3C.

FIG. 4 illustrates an exemplary overlay measurement pattern. The overlay measurement pattern 400 of FIG. 4 that may be used as the overlay measurement pattern 206 of FIG. 2B or the overlay measurement pattern 516 of FIG. 8 and may be produced in the resist material layer 203 has four different overlay measurement patterns. In some embodiments, when the overlay measurement pattern 400 on the top coincides with the bottom overlay measurement pattern 208 of FIG. 2B, the upper right portion 402 and the lower left portion 404 of the overlay measurement pattern 400 respectively have an initial shift of −D and +D in the positive X-direction with respect to the bottom overlay measurement pattern 208. In some embodiments, the overlay measurement pattern 400 on the top is placed with an X-direction overlay error OV, e.g., overlay placement error in the X-direction, over the bottom overlay measurement pattern 208 and thus the AS function between the upper right portion 402 and the bottom overlay measurement pattern 208 becomes equation (3):

$$AS1 = k \cdot \sin\left[\left(\frac{2\pi}{P}\right) \cdot (OV - D)\right] \quad \text{Eq. (3)}$$

which is a point on the AS function 320 of FIG. 3C with a shift S=(OV−D). The AS function between the upper right portion 402 and the bottom overlay measurement pattern 208 may be approximated as AS1=K·(OV−D), which is a point on the slope 322 of the AS function 320 of FIG. 3C with the shift S=(OV−D). Also, the AS function between the lower left portion 404 and the bottom overlay measurement pattern 208 becomes equation (4):

$$AS2 = k \cdot \sin\left[\left(\frac{2\pi}{P}\right) \cdot (OV + D)\right] \quad \text{Eq. (4)}$$

which is a point on the AS function 320 of FIG. 3C with a shift S=(OV+D). The AS function between the lower left portion 404 and the bottom overlay measurement pattern 208 may be approximated as AS2=K·(OV+D), which is a point on the slope 322 of the AS function 320 of FIG. 3C with the shift S=(OV+D). Thus, by using the optical system 220 of FIG. 2B and measuring the detected negative and positive first order diffractions 211 and 213, the AS function value AS1 between the upper right portion 402 of the overlay measurement pattern 400 and the bottom overlay measurement pattern 208 and the AS function value AS2 between the lower left portion 404 of the overlay measurement pattern 400 and the bottom overlay measurement pattern 208 can be determined and the overlay error OV in the X-direction may be determined as:

$$OV = D \cdot \left(\frac{AS1 + AS2}{AS2 - AS1}\right) \quad \text{Eq. (5)}$$

In some embodiments, when the overlay measurement pattern 400 on the top coincides with the bottom overlay measurement pattern 208, the upper left portion 401 and the lower right portion 405 of the overlay measurement pattern 400 respectively have an initial shift of −D and +D in the positive Y-direction with respect to the bottom overlay measurement pattern 208. Thus, the overlay error in the Y-direction may similarly be determined.

In some embodiments, as shown in FIGS. 1A and 1B, the extent 113 of each portion of the overlay measurement pattern 400 or the overlay measurement patterns 206 and 208 is between 300 nm and 40,000 nm. A CD of the sub-patterns, e.g., boxes, of each portion of the overlay measurement pattern 400 or the overlay measurement patterns 206 and 208 is between 10 nm and 1400 nm. A pitch between the sub-patterns of each portion of the overlay measurement pattern 400 or the overlay measurement patterns 206 and 208 is between 100 nm and 1500 nm. In some embodiments, the upper layer and lower layer measurement patterns of FIGS. 6A, 6B, and 7A are repeated in the four quadrants similar to FIG. 4. Additionally, the measurement patterns of the upper layer in FIGS. 6A, 6B, and 7A respectively have the initial shifts of −D and +D in the positive Y-direction and in the positive X-direction in the four quadrants and, thus, the equations (3)-(5) may be used for determining the overlay error in FIGS. 6A, 6B, and 7A.

Figure 5C:
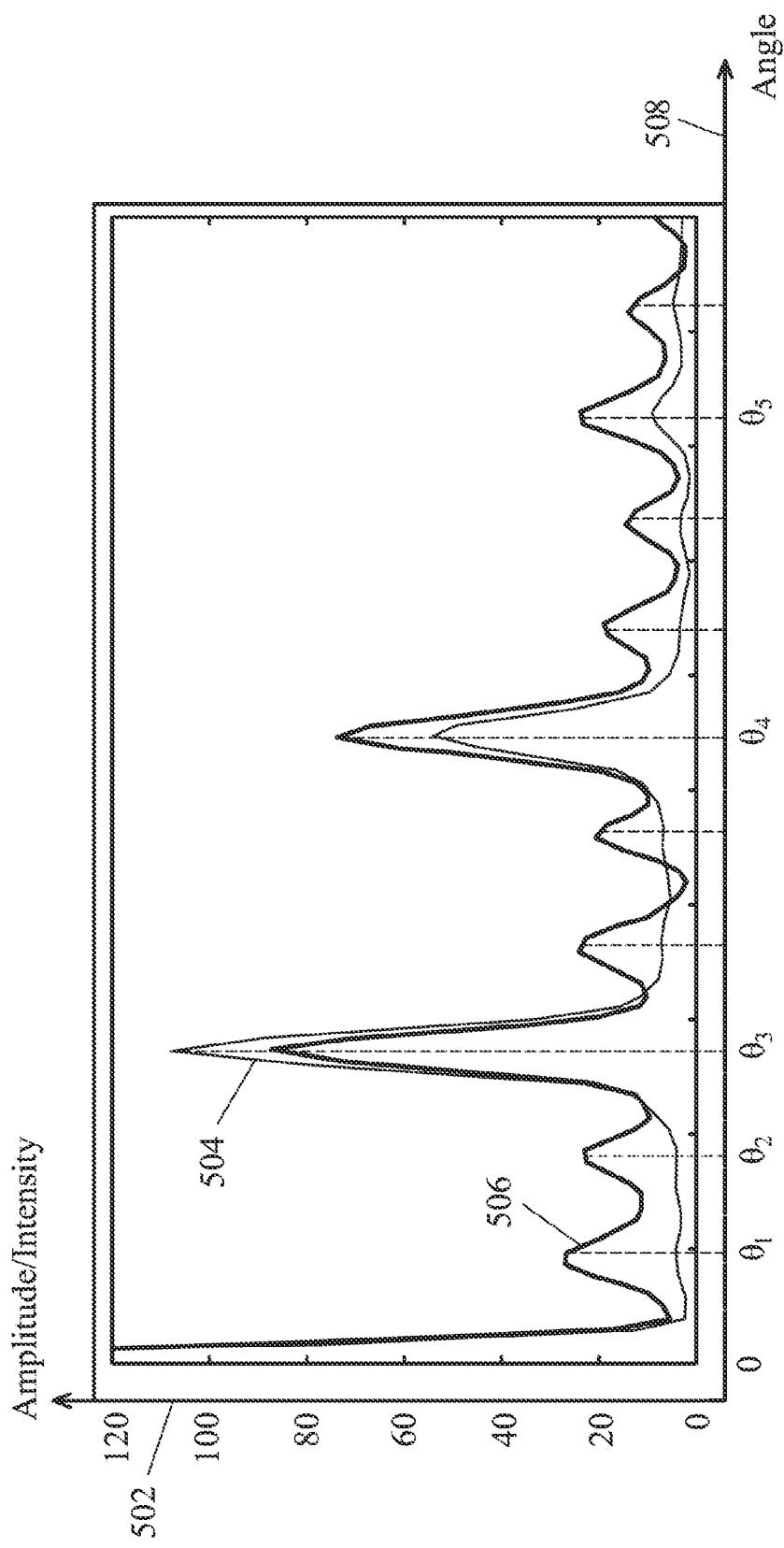

FIGS. 5A, 5B, 5C, and 5D respectively illustrate an overlay measurement pattern 520, e.g., a combination of two overlay measurement patterns in the same layer, with different pitches on a substrate, an incident light beam and first order diffractions reflected from the combination of the two overlay measurement patterns on the substrate, a graph of intensity/amplitude of the diffracted light from the substrate, and a top view of the overlay measurement pattern 520 in accordance with some embodiments of the present disclosure. FIG. 5A illustrates a substrate 500 that has the underlying substrate 200 and the overlay measurement pattern 520 disposed on the underlying substrate 200. The overlay measurement pattern 520 includes a first measurement pattern, e.g., a first grating, having sub-patterns 522, e.g., dark strips, consistent with the dark strips 114 of FIGS. 1A and 1B, that has an equal distance, a first pitch 535, between each two neighboring sub-patterns 522. The combination of two overlay measurement patterns also includes a second measurement pattern, e.g., a second grating, having sub-patterns 524, e.g., dark strips, consistent with the dark strips 114 of FIGS. 1A and 1B, that has an equal distance, a second pitch 537, between each two neighboring sub-patterns 524. In some embodiments, the first pitch 535 is between 2 to 10 times (e.g., natural number times) larger than the second pitch 537 and, thus, between 2 to 10 sub-patterns 524 are distributed in the interval of the first pitch 535 between each two neighboring sub-patterns 522. In some embodiments, the critical dimension (CD) is the size of a feature on a semiconductor circuit that impacts the electrical properties of the device and, thus, the semiconductor manufacturing process steps are designed to avoid affecting the CD of the layout pattern of the layers. As shown in FIG. 5A, in some embodiments, because the first pitch 535 of the sub-patterns 522 of a layer is much larger than the CD, by adding extra sub-patterns 524, between the sub-patterns 522, the pitch of the overlay measurement pattern is reduced and becomes comparable with the CD of the semiconductor circuit. Thus, the semiconductor manufacturing process steps do not impact the combination of the sub-patterns 522 and sub-patterns 524.

FIG. 5B shows the substrate 500 of FIG. 5A and additionally includes an incident light beam 542 that is incident on the substrate 500 and two first order diffractions 546 and 548 that are reflected from the substrate 500, e.g., reflected from the overlay measurement pattern 520. In some embodiments, the incident light beam 542 is transmitted along a perpendicular line 540, which is perpendicular to a surface 201 of the underlying substrate 200. The first order diffraction 546 is a negative first order diffraction that is reflected from the first grating, having the sub-patterns 522. The first order diffraction 546 has an angle $\theta_1$ with the line 540. Another first order diffraction 548 is a negative first order diffraction that is reflected from the second grating, having the sub-patterns 524. The first order diffraction 548 has an angle $\theta_3$ with the perpendicular line 540. In some embodiments, a ratio between the tangent of the angle $\theta_3$ to the tangent of the angle $\theta_1$ is the ratio between the first pitch 535 and the second pitch 537. Thus, in some embodiments, the angle $\theta_3$ is about 2 to about 4 times, e.g., about 3 times, the angle $\theta_1$. For each one of the negative first order diffractions 546 and 548 a positive first order diffraction is also reflected from the substrate 500. The positive first order diffractions (not shown) are reflected in a direction such that the positive and negative first order diffractions are symmetrical with respect to perpendicular line 540. In some embodiments and consistent with FIGS. 2A and 2B, the overlay measurement pattern 520 is disposed in the first layer 204 such that the first layer 204 covers the overlay measurement pattern 520.

FIG. 5C shows the graphs of light intensity per reflected angle of the diffracted light from the overlay measurement pattern 520 of the substrate 500. The light intensity is shown on an intensity coordinate 502 and the reflected angles are shown on an angle coordinate 508. The diffraction patterns are reflected from the overlay measurement pattern 520 when the incident light beam 542 is directed to the surface 201 of the substrate 500 and irradiates the overlay measurement pattern 520 that includes the first grating of the sub-patterns 522 and the second grating of the sub-patterns 524. A graph 506 is the diffraction patterns associated with the sub-patterns 522 and a graph 504 is associated with the sub-patterns 524. As shown, the graphs 506 and 504 are displayed in the intensity coordinate 502 versus the angle coordinate 508. In some embodiments, the first bump of the graph 506 at the angle $\theta_1$ corresponds to the first order diffraction from the first grating of the sub-patterns 522 and the second bump of the graph 506 at the angle $\theta_2$ corresponds to the second order diffraction from the first grating of the sub-patterns 522. In some embodiments, the third bump of the graph 506 at the angle $\theta_3$, corresponds to the third order diffraction from the first grating of the sub-patterns 522. In some embodiments, as shown in FIG. 5C, the third bump of the graph 506 coincides with the first bump of the graph 504 at the angle $\theta_3$. In some embodiments and referring back to FIG. 5B, the first bump of the graph 506 at the angle $\theta_1$ is consistent with the negative first order diffraction 546 that is reflected from the first grating, however, the higher order diffractions having angles greater than $\theta_1$ with the perpendicular line 540 that are reflected from the first grating, having the sub-patterns 522, are not shown in FIG. 5B. In some embodiments, the first bump of the graph 504 at the angle $\theta_3$ is consistent with the negative first order diffraction 548 that is reflected from the second grating. The higher order diffractions having angles $\theta_4$ and $\theta_5$ that are reflected from the second grating, having the sub-patterns 524, are not shown in FIG. 5B.

In some embodiments, the first grating of the sub-patterns 522 and the second grating of the sub-patterns 524 are repeated and, thus, are period structures. In some embodiments, the first, second, third, etc. bumps at the angles $\theta_1$, $\theta_2$, $\theta_3$, etc., of the graph 506, correspond to the frequency content, e.g., Fourier series components, of the first grating of the sub-patterns 522. Similarly, the first, second, third, etc. bumps at the angles $\theta_3$, $\theta_4$, $\theta_5$, etc., of the graph 504, correspond to the frequency content, e.g., Fourier series components, of the second grating of the sub-patterns 524.

FIG. 5D shows a top view of the overlay measurement pattern 520. The overlay measurement pattern 520 includes the sub-patterns 522 that are distributed in the X-direction with the first pitch 535 and extend in an interval 519 in the Y-direction. The overlay measurement pattern 520 also includes the sub-patterns 524 that are distributed in the X-direction with the second pitch 537 and extend in an interval 517 in the Y-direction.

FIGS. 6A and 6B respectively illustrate cross-sectional views of a substrate 602 having an underlying substrate 200, the first layer 204 on top of the underlying substrate 200 having an overlay measurement pattern, a second layer 202 on top of the first layer 204, and another overlay measurement pattern over the second layer 202 in accordance with some embodiments of the present disclosure. FIG. 6A shows the overlay measurement pattern 520 in the first layer 204 over the underlying substrate 200 and the overlay measurement pattern 516 that is above the second layer 202. As discussed, the second layer 202 is disposed above the first layer 204 and the resist material layer 203 that includes the overlay measurement pattern 516 is disposed over the second layer 202. FIG. 6A shows a pitch 535 between sub-patterns 518 of the overlay measurement pattern 516, e.g., the upper overlay measurement pattern. The overlay measurement pattern 520, e.g., the lower overlay measurement pattern includes a combination of two overlay measurement patterns, the sub-patterns 524 and the sub-patterns 522. In some embodiments, the pitch between the sub-patterns 522 is the same as the pitch 535 between the sub-patterns 518 of the overlay measurement pattern 516. In some embodiments, a pitch 537 exist between the sub-patterns 524, and the pitch 537 is smaller than the pitch 535, for example, the pitch 537 is one third of the pitch 535.

FIG. 6B shows an overlay measurement pattern 530 in the first layer 204 over the underlying substrate 200 and an overlay measurement pattern 526 that is above the second layer 202. As discussed, the second layer 202 is disposed above the first layer 204 and the resist material layer 203 that includes the overlay measurement pattern 526 is disposed over the second layer 202. FIG. 6B shows a pitch 536 between sub-patterns 528 of the overlay measurement pattern 526, e.g., the upper overlay measurement pattern. The overlay measurement pattern 530, e.g., the lower overlay measurement pattern has sub-patterns 534 and sub-patterns 532. In some embodiments, the pitch between the sub-patterns 532 is the same as the pitch 536 between the sub-patterns 528 of the overlay measurement pattern 526. The overlay measurement pattern 530 also includes sub-patterns 534 with a pitch 538 of, for example, one fourth of the pitch 536. In some embodiments, a material and the height 119 of the sub-patterns 532 and the sub-patterns 534 are the same and, thus, the sub-patterns 532 and 534 are disposed together by depositing a layer on the underlying substrate 200 and etching the layer to simultaneously generate both sub-patterns 532 and 534. In some embodiments, as shown in FIG. 6B, two or more sub-patterns 532 and sub-patterns 534 are etched as one segment and, thus, one sub-pattern 532 and an adjacent sub-pattern 534 are generated as one segment. As shown in FIG. 6B, every fourth of the sub-patterns 534 is connected from the left side to a right side of one of the sub-patterns 532.

FIG. 7A shows the substrate 602 of FIG. 6A that includes the overlay measurement pattern 520 in the first layer 204 over the underlying substrate 200 and the overlay measurement pattern 516 that is above the second layer 202. As shown in FIG. 7A, a light source of an optical system consistent with the light source 226 of the optical system 220 transmits an incident light beam 542 consistent with the incident light beam 214 of FIG. 2B to the overlay measurement patterns 516 and 520. As shown in FIG. 7A, a first order diffraction 544 that is consistent with the negative first order diffraction 210A of FIG. 2B is reflected from the overlay measurement pattern 516. Also, a first order diffraction 546 that is consistent with the negative first order diffraction 212A of FIG. 2B is reflected from the overlay measurement pattern 520. In addition, another negative first order diffraction 548 is reflected from the overlay measurement pattern 520. In some embodiments, the negative first order diffraction 546 is reflected from the sub-patterns 522 of the overlay measurement pattern 520 having the pitch 535 and the negative first order diffraction 548 is reflected from the sub-patterns 524 of the overlay measurement pattern 520 having the shorter pitch 537. The shorter pitch 537 is about ½ to ⅕, e.g., ⅓, of the pitch 535 in some embodiments.

In addition, as shown in FIG. 7A, the negative first order diffraction 544 from the sub-patterns 518 and the negative first order diffraction 546 from the sub-patterns 522 are in parallel and have an angle $\theta_1$ with respect to the perpendicular line 540 and, thus, may be combined. Also, as shown in FIG. 7A, the negative first order diffraction 548 from the sub-patterns 524 has an angle $\theta_3$ with the perpendicular line 540. In some embodiments, as discussed above, the pitch 535 is about two time to about five times, e.g., about 3 times, the pitch 537 and, thus, the tangent of the angle $\theta_3$ is about two time to about five times the tangent of the angle $\theta_1$, e.g., is about 3 times the tangent of the angle $\theta_1$. Thus, the negative first order diffraction 548 may be isolated from the negative first order diffraction 544 and the negative first order diffraction 546. As noted above, the positive first order diffractions (not shown) are also reflected from the overlay measurement pattern 516 and the overlay measurement pattern 520. The positive first order diffractions are in a direction such that the positive and negative first order diffractions are symmetrical with respect to the perpendicular line 540.

Figure 7B:
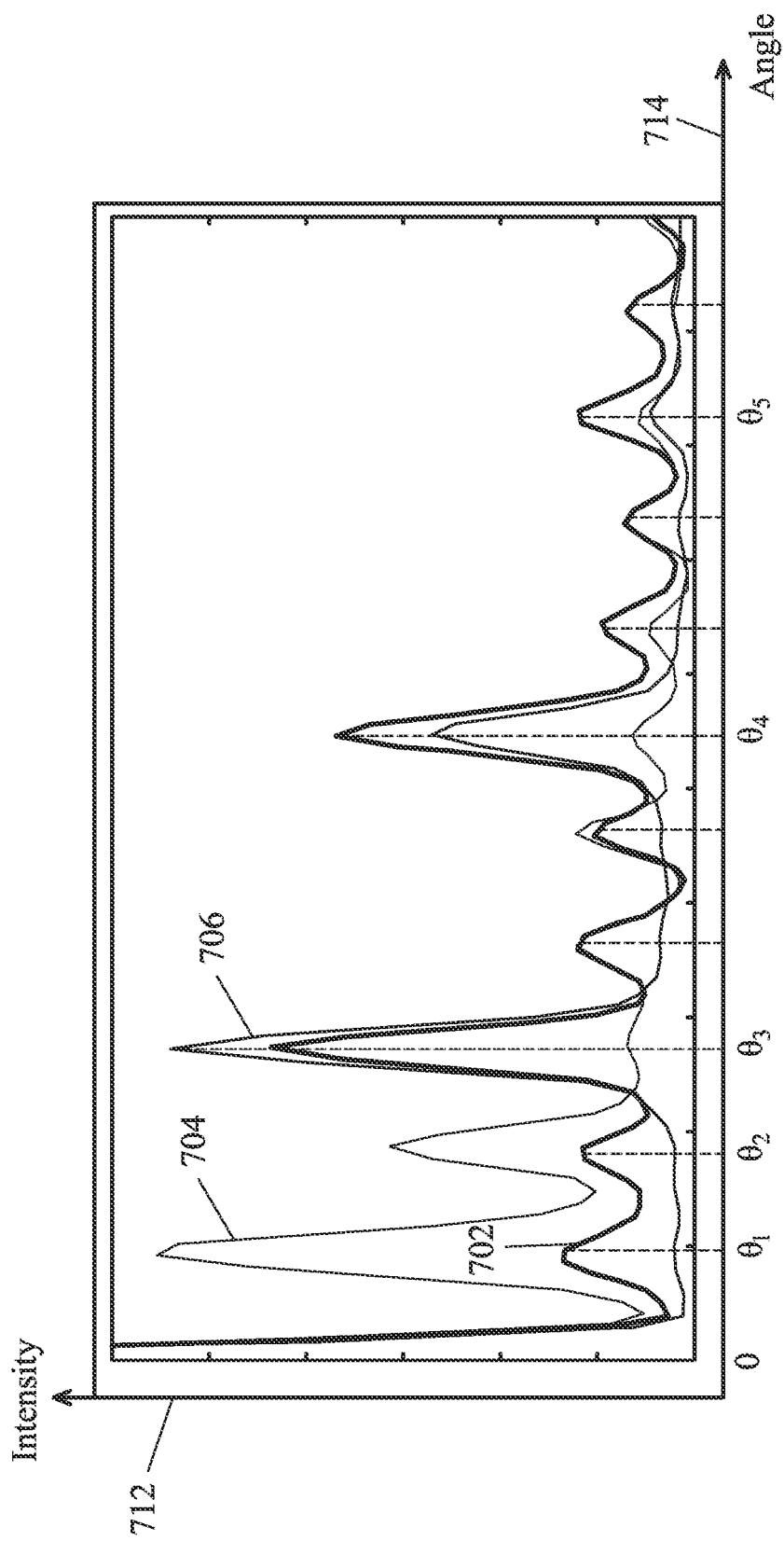

FIG. 7B shows the graphs of light intensity per reflected angle of the diffracted light from the overlay measurement pattern 516 and the overlay measurement pattern 520 of the substrate 602. The light intensity is shown on an intensity coordinate 712 and the reflected angles are shown on an angle coordinate 714. The diffraction patterns are reflected from the overlay measurement pattern 516 and the overlay measurement pattern 520 when the incident light beam 542 is directed to the substrate 602 as shown in FIG. 7A. A graph 702 is the diffraction patterns associated with the sub-patterns 522 of the overlay measurement pattern 520 and a graph 706 is associated with the sub-patterns 524 of the overlay measurement pattern 520. In addition, a graph 704 is associated with the sub-patterns 518 of the overlay measurement pattern 516. As shown, the graphs 702, 704, and 706 are displayed in the intensity coordinate 712 versus the angle coordinate 714. In some embodiments, the first bump of the graph 702 at the angle $\theta_1$ corresponds to the first order diffraction from the sub-patterns 522 of the overlay measurement pattern 520 and the second bump of the graph 702 at the angle $\theta_2$ corresponds to the second order diffraction from the sub-patterns 522. In addition, because the sub-patterns 522 of the overlay measurement pattern 520 and the sub-patterns 518 of the overlay measurement pattern 516, have the same pitch 535, the first bump of the graph 704 corresponding to the first order diffraction from the sub-patterns 518 of the overlay measurement pattern 516 is also observed at the angle $\theta_1$. In addition, the first order diffraction from the sub-patterns 518 of the overlay measurement pattern 516 and the first order diffraction from the sub-patterns 522 of the overlay measurement pattern 520 that travel the same direction may be combined.

In some embodiments, as shown in FIG. 7B, the third bump of the graphs 702 and 704, coincide with the first bump of the graph 706 at the angle $\theta_3$. Thus, the first order diffraction from the sub-patterns 522 of the overlay measurement pattern 520 and first order diffraction from the sub-patterns 518 of the overlay measurement pattern 516 travel at the same direction that is separate and distinct from the direction that the first order diffraction from the sub-patterns 524 of the overlay measurement pattern 520 travel. Therefore, the first order diffraction from the sub-patterns 522 of the overlay measurement pattern 520 and first order diffraction from the sub-patterns 518 of the overlay measurement pattern 516 may be isolated from the first order diffraction from the sub-patterns 524 of the overlay measurement pattern 520. As noted above, the semiconductor manufacturing process steps are designed to avoid affecting the CD of the layout pattern of a layer. As shown in FIGS. 6A, 6B, and 7A, in some embodiments, because the pitch of the sub-patterns 522/532 of the layer is much larger than the CD, by adding extra sub-patterns 524/534, between the sub-patterns 522/532, the pitch of the overlay measurement pattern is reduced and becomes comparable with the CD semiconductor circuit. Thus, the subsequent semiconductor manufacturing process steps do not impact the combination of the sub-patterns 522/532 and sub-patterns 524/534. In addition, the added sub-patterns 524/534 produce the negative first order diffraction 548 that may be isolated from the negative first order diffraction 544 and the negative first order diffraction 546. In some embodiments, the first order diffraction 548 is filtered, e.g., is physically blocked. Thus, only the negative first order diffraction 544 and the negative first order diffraction 546 are detected.

Figure 7C:
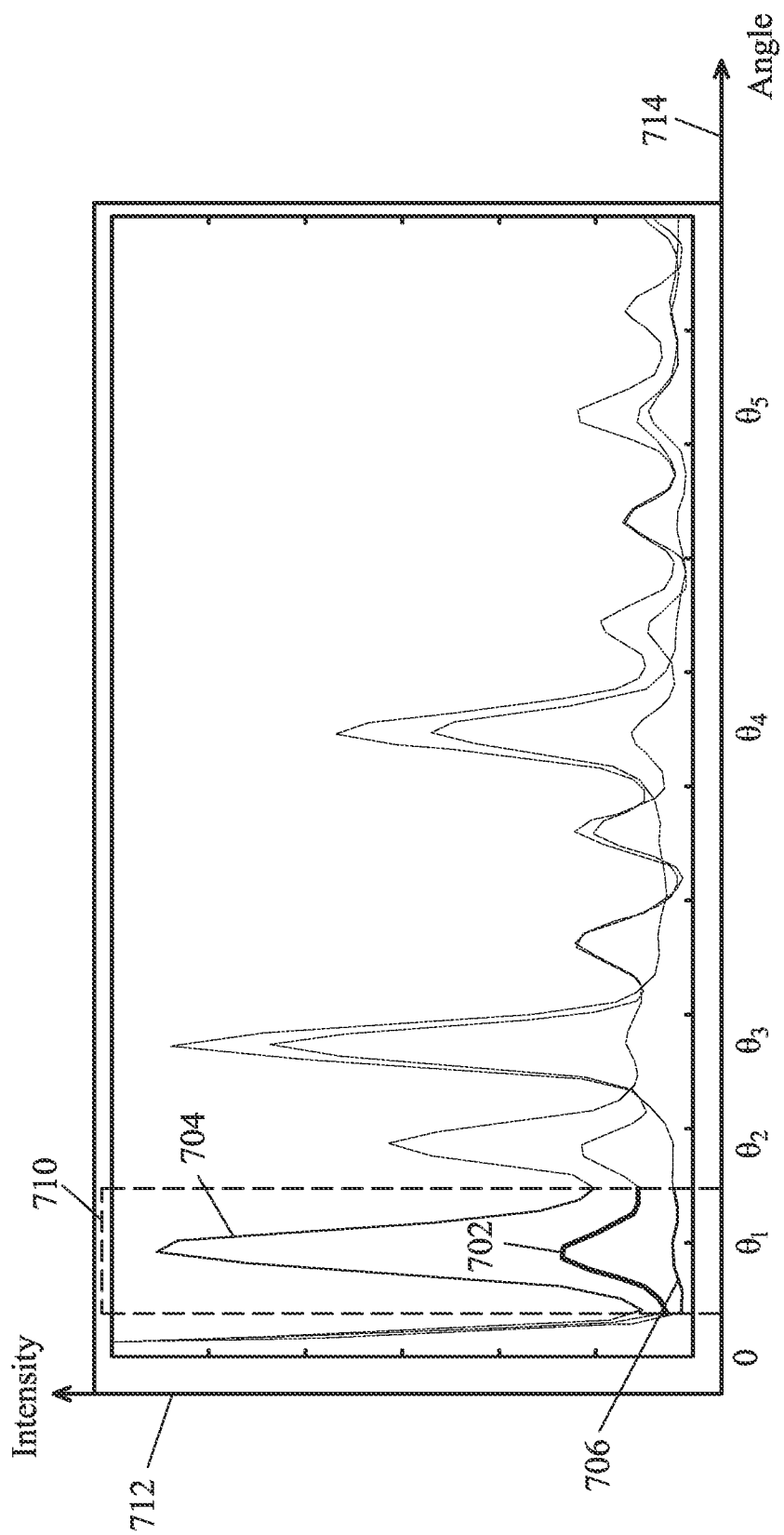

FIG. 7C shows the graphs 702, 704, and 706 that are displayed in the intensity coordinate 712 versus the angle coordinate 714. As shown in FIG. 7C, a segment 710 of the graphs 702, 704, and 706 is around the angle $\theta_1$. Thus, as shown in segment 710, the first order diffraction from the sub-patterns 518 of the overlay measurement pattern 516 (the bump of the graph 702 at the angle $\theta_1$) and the first order diffraction from the sub-patterns 522 of the overlay measurement pattern 520 (the bump of the graph 704 at the angle $\theta_1$) may be combined. However, as the first order diffraction from the sub-patterns 524 is negligible in segment 710 (the graph 706 is negligible), the first order diffraction from the sub-patterns 524 may be isolated from the first order diffraction from the sub-patterns 518 of the overlay measurement pattern 516 and the first order diffraction from the sub-patterns 522 of the overlay measurement pattern 520.

FIG. 8 illustrates a measurement system for determining an overlay error in accordance with some embodiments of the disclosure. The measurement system of FIG. 8 shows the substrate 602 that is mounted on a stage 551 and the stage 551 that is coupled to and controlled by a stage controller 560. FIG. 8 also shows the optical system 220 that is mounted above the substrate 602. In some embodiments, one of the light sources of the optical system 220 transmits an incident light beam 515, consistent with the incident light beams 214 and 542 of FIGS. 2B and 7A, to the overlay measurement patterns 516 and 520. A portion of the incident light beam 515 is diffracted and reflected from the overlay measurement pattern 516 and produces the negative and positive first order diffractions 583A and 583B (at the angle $\theta_1$ with the perpendicular line 540) that are inner portions of first order diffractions 582 and 586 respectively. A remaining portion of the incident light beam 515 passes through the overlay measurement pattern 516 and the second layer 202 and gets diffracted and reflected from the sub-patterns 522 of the overlay measurement pattern 520 of the first layer 204 and produces the negative and positive first order diffractions 585A and 585B (at the angle $\theta_1$ with the perpendicular line 540) that are outer portions of first order diffractions 582 and 586 respectively. The negative and positive first order diffractions 582 and 586 are detected by the detector 222 of the optical system 220. The analyzer module 230 receives corresponding signals of the detected first order diffractions 582 and 586 and performs an analysis as described with respect to FIGS. 3B and 3C on the corresponding signals to determine a shift distance 302 between the overlay measurement patterns 516 and 520.

In addition, the remaining portion of the incident light beam 515 that passes through the overlay measurement pattern 516 and the second layer 202, also gets diffracted and reflected from the sub-patterns 524 of the overlay measurement pattern 520 of the first layer 204 and produces the negative and positive first order diffractions 525A and 525B (at the angle $\theta_3$ with the perpendicular line 540). Also, FIG. 8 shows apertures 550 (or pupil filters) of the detectors 222 of the optical system 220. The reflected and diffracted light may pass through the apertures 550 to the detectors 222. The barriers 601 outside the apertures 550 are used to block the diffractions from entering the optical system and being detected by the detectors 222. In some embodiments, the numerical aperture of the detectors 222 are designed such that the negative and positive first order diffractions 525A and 525B do not enter the detectors 222.

Figure 9:
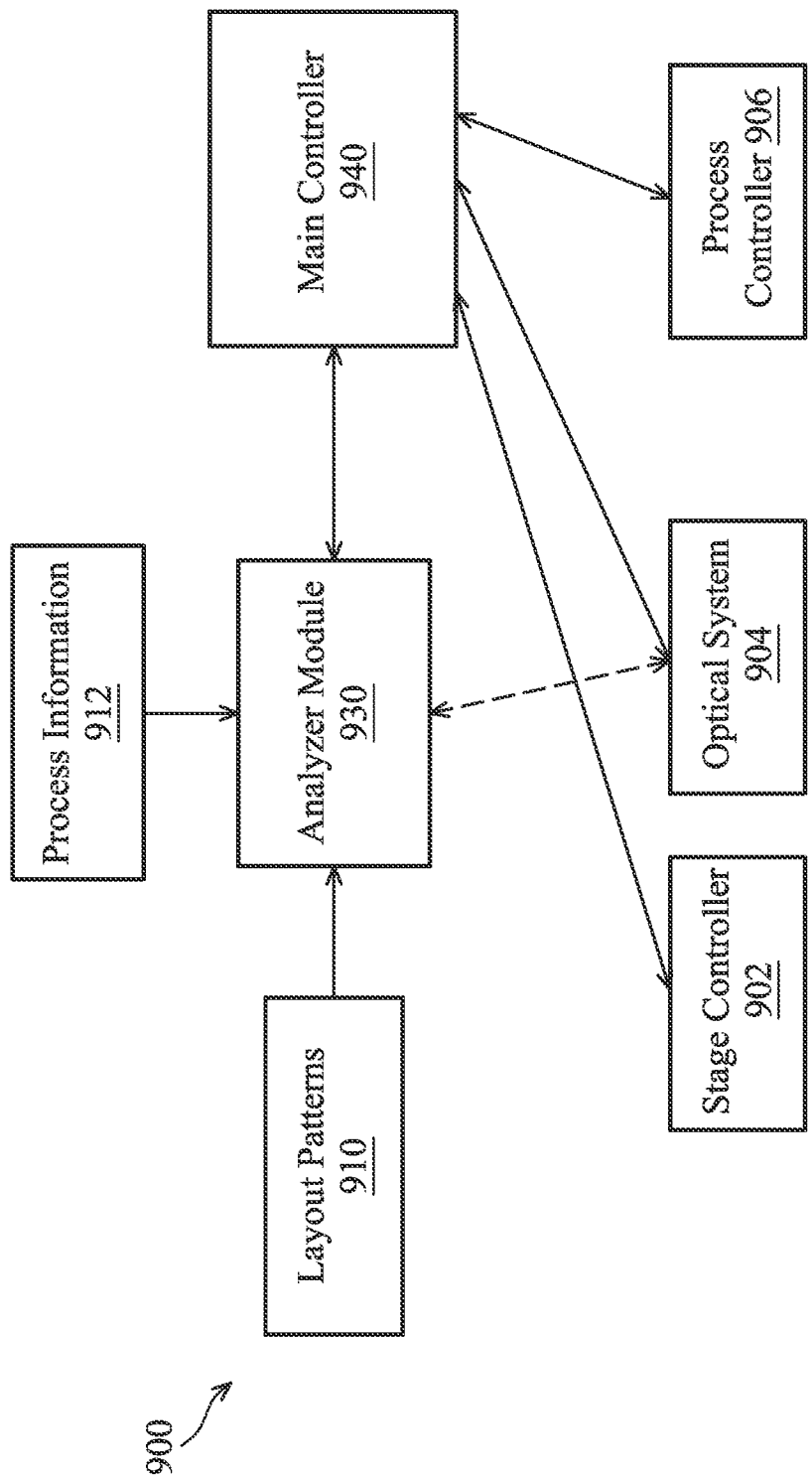
FIG. 9 illustrates an exemplary measurement system for determining an overlay error in accordance with some embodiments of the disclosure.

FIG. 9 illustrates an exemplary measurement system for determining an overlay error in accordance with some embodiments of the disclosure. The system 900 includes an analyzer module 930 and a main controller 940 coupled to each other. The analyzer module 930, which is consistent with the analyzer module 230 of FIGS. 2B and 8 receives one or more layout patterns 910 to be generated in the first layer 204 and the resist material layer 203. The analyzer module 930 may either directly connect to an optical system 904 or may connect to the optical system 904 via the main controller 940. In some embodiments, the analyzer module 930 receives a process information 912 that includes information of the semiconductor process steps for creating the semiconductor devices and also includes the sizes of the critical dimension of the devices and the connection lines. In some embodiments, a stage controller 902 is consistent with the stage controller 560 of FIG. 8.

In some embodiments, the main controller 940 is coupled to a process controller 906, the optical system 904, and the stage controller 902. In some embodiments and returning back to FIGS. 2B and 8 the optical system 904 is consistent with the optical system 220. The optical system 904, which is controlled by the main controller 940, generates the incident light beams 214, 515, and 542 of FIGS. 2B, 7A, and 8. In addition, the optical system 904 receives the diffracted light from the overlay measurement patterns and detects the diffracted light and generates corresponding signals of the detected diffracted light. The optical system 904 sends the corresponding signals of the detected diffracted light to the analyzer module 930 for analysis as described above to determine a shift distance between overlay measurement patterns 516 and 520 of the substrate 602.

In some embodiments, the analyzer module 930 sends the one or more layout patterns 910 directly or via the main controller 940 to the process controller 906 and commands the process controller 906 to produce, e.g., to deposit, the one or more layout patterns 910 in the first layer 204 and the resist material layer 203. As described, the overlay measurement pattern of the lower layer, e.g., the overlay measurement pattern 520 of FIGS. 6A, 7A, and 8 in addition to having the sub-patterns 522 with the same pitch as the sub-patterns 518 of the resist material layer 203, includes another more dense sub-patterns 524. In some embodiments, a pitch of the sub-patterns 522 is about 2 to about 20 times, e.g., about 3 times, longer than the pitch of the sub-patterns 524. In some embodiments, as the pitch of the sub-patterns 524 decreases, the angle $\theta_3$, with respect to the perpendicular line 540, of the first order diffraction 548 generated by the sub-patterns 524 increases. Thus, in some embodiments, the pitch of the sub-patterns 524 and width of the sub-patterns 522 and/or 524 are selected such that the overlay measurement pattern 520 of FIGS. 6A, 7A, and 8 has about the same pitch size as the critical dimension of the devices that are created on the underlying substrate 200. In some embodiments, the critical dimension of the devices (e.g., a width of a fin structure or a width of a gate pattern) is between 10 nm and 50 nm and the pitch size of the overlay measurement pattern 520 is between about 10 nm and about 50 nm. In some embodiments, the overlay measurement pattern 520 has a pitch size that is in the range between 50 percent less than the average critical dimension of the devices and 50 percent more than the average critical dimension of the devices, e.g., the pitch size of the overlay measurement pattern 520 is between about 5 nm and about 75 nm.

Figure 10:
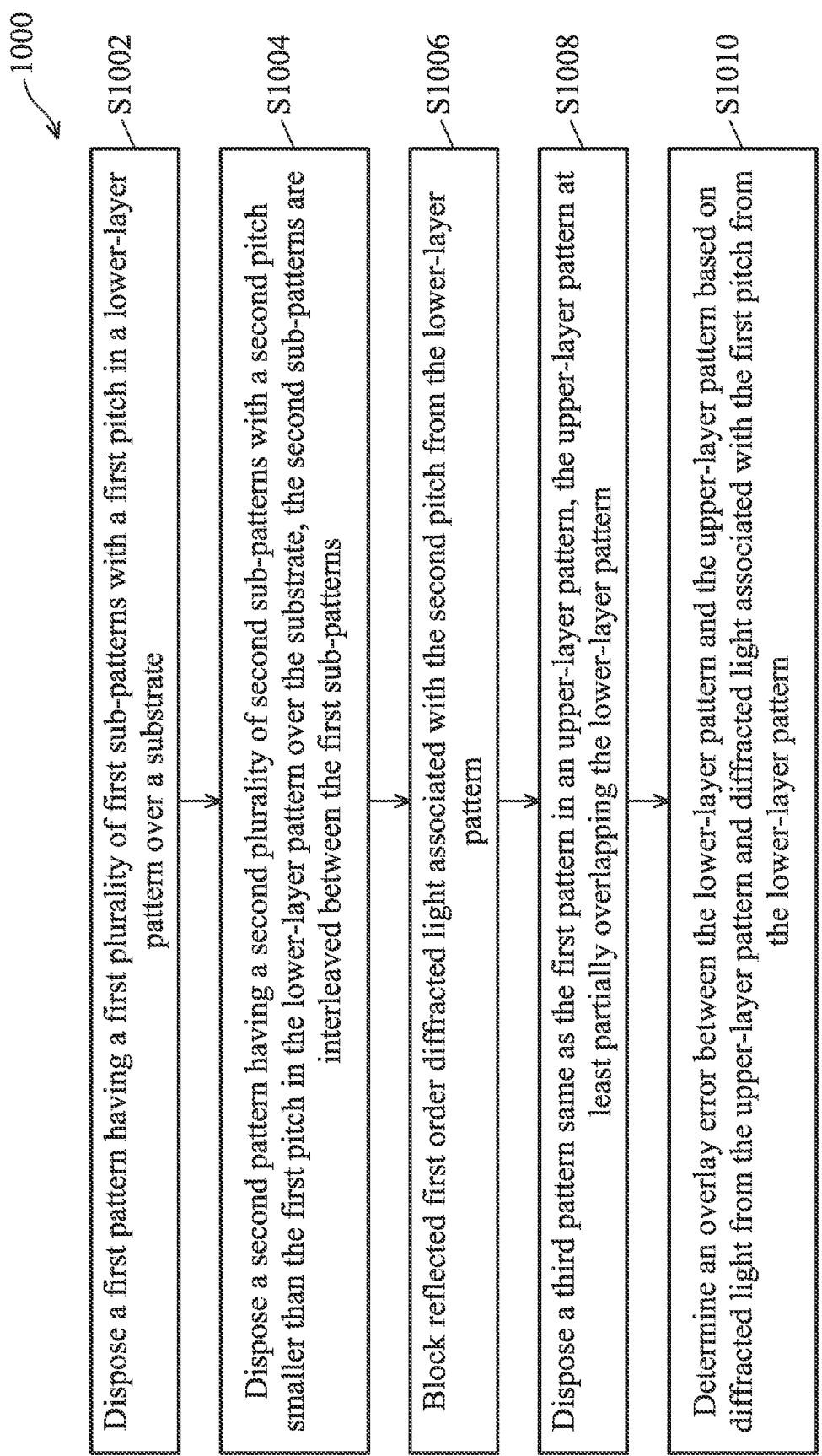
FIG. 10 illustrates a flow diagram of an exemplary process for determining an overlay error in accordance with some embodiments of the disclosure.

FIG. 10 illustrates a flow diagram of an exemplary process 1000 for determining an overlay error, e.g., a shift distance 302, between the overlay measurement patterns 516 and 520, in accordance with some embodiments of the disclosure. The process 1000 may be performed by the measurement systems of FIGS. 8 and 9. In some embodiments, a portion of the process 1000 is performed and/or is controlled by the computer system 1100 described below with respect to FIGS. 11A and 11B. The method includes the operation S1002 that a first pattern having a first plurality of first sub-patterns with a first pitch is created, e.g., is disposed, in a lower-layer pattern (e.g., a lower-layer overlay measurement pattern) over a substrate. As shown in FIGS. 6A and 7A, the first pattern of the first plurality of sub-patterns 522 with a pitch 535 is created in the first layer 204.

In operation S1004, a second pattern having a second plurality of second sub-patterns with a second pitch smaller than the first pitch is created in the lower-layer pattern over the substrate. As shown in FIGS. 6A and 7A, the second pattern of the second plurality of second sub-patterns 524 with a pitch 537 smaller than the pitch 535 is created in the first layer 204 that is over the substrate 200 and the sub-patterns 524 are interleaved between the sub-patterns 522.

In operation S1006, a reflected first order diffracted light, e.g., the first order diffraction 548 or 525A of FIG. 7A or 8, associated with the pitch 537 from the lower-layer pattern is blocked and does not enter the detector 222.

In operation S1008, a third pattern having the first pitch is created in an upper-layer pattern (e.g., an upper-layer overlay measurement pattern). The upper-layer pattern at least partially overlapping the lower-layer pattern. As shown in FIGS. 6A and 7A, the third pattern of sub-patterns 518, which has the same pitch 535 as the sub-patterns 522, is created in the resist material layer 203. The third pattern of the sub-patterns 518 at least partially overlap the first pattern of the sub-patterns 522.

In operation S1010, an overlay error between the lower-layer pattern and the upper-layer pattern is determined based on diffracted light from the upper-layer pattern and diffracted light associated with the first pitch from the lower-layer pattern. As shown in FIGS. 8, the optical system 220 transmits the incident light beam 515 to the overlay measurement pattern 516 that is on top of the overlay measurement pattern 520. The reflected first order diffractions 582 and 586 from the sub-patterns 518 and from the sub-patterns 522 are detected by the optical system 220 and the detected signals are transmitted to the analyzer module 230. The analyzer module 230 determines, e.g., calculates, the layout error, the shift distance, between the overlay measurement pattern 516 and the overlay measurement pattern 520. The negative first order diffractions 583A and 585A respectively from the sub-patterns 518 and sub-patterns 522 are combined and detected by one of the detectors 222. The positive first order diffractions 583B and 585B respectively from the sub-patterns 518 and sub-patterns 522 are combined and detected by another detectors 222. The overlay error is determined based on the detected signals of the detectors 222.

FIGS. 11A and 11B illustrate an apparatus for determining an overlay error in accordance with some embodiments of the disclosure. FIG. 11A is a schematic view of a computer system 1100 that executes the process for determining the overlay error according to one or more embodiments as described above. All of or a part of the processes, method and/or operations of the foregoing embodiments can be realized using computer hardware and computer programs executed thereon. The operations include controlling an optical system and the light sources and detectors of the optical system, controlling the process of disposing the layers, and controlling the movement of a stage holding a substrate. Thus, in some embodiments, the computer system 1100 provides the functionality of the analyzer module 930, the main controller 940, the stage controller 902, the process controller 906, and a controller of the optical system 904. In FIG. 11A, a computer system 1100 is provided with a computer 1101 including an optical disk read only memory (e.g., CD-ROM or DVD-ROM) drive 1105 and a magnetic disk drive 1106, a keyboard 1102, a mouse 1103, and a monitor 1104.

FIG. 11B is a diagram showing an internal configuration of the computer system 1100. In FIG. 11B, the computer 1101 is provided with, in addition to the optical disk drive 1105 and the magnetic disk drive 1106, one or more processors 1111, such as a micro-processor unit (MPU), a ROM 1112 in which a program such as a boot up program is stored, a random access memory (RAM) 1113 that is connected to the processors 1111 and in which a command of an application program is temporarily stored and a temporary storage area is provided, a hard disk 1114 in which an application program, a system program, and data are stored, and a bus 1115 that connects the processors 1111, the ROM 1112, and the like. Note that the computer 1101 may include a network card (not shown) for providing a connection to a LAN.

The program for causing the computer system 1100 to execute the process for determining an overlay error of a semiconductor device in the foregoing embodiments may be stored in an optical disk 1121 or a magnetic disk 1122, which are inserted into the optical disk drive 1105 or the magnetic disk drive 1106, and transmitted to the hard disk 1114. Alternatively, the program may be transmitted via a network (not shown) to the computer 1101 and stored in the hard disk 1114. At the time of execution, the program is loaded into the RAM 1113. The program may be loaded from the optical disk 1121 or the magnetic disk 1122, or directly from a network. The program does not necessarily have to include, for example, an operating system (OS) or a third party program to cause the computer 1101 to execute the process for determining the overlay error of a semiconductor device in the foregoing embodiments. The program may only include a command portion to call an appropriate function (module) in a controlled mode and obtain desired results.

It will be understood that not all advantages have been necessarily discussed herein, no particular advantage is required for all embodiments or examples, and other embodiments or examples may offer different advantages.

According to some embodiments of the present disclosure, a method of overlay error measurement includes disposing a lower-layer pattern over a substrate of a semiconductor device that includes disposing a first pattern having a first plurality of first sub-patterns extending in a first interval along a first direction and being arranged with a first pitch in a second direction crossing the first direction and disposing a second pattern having a second plurality of second sub-patterns interleaved between the first sub-patterns and extending in a second interval along the first direction and being arranged with a second pitch, smaller than the first pitch, in the second direction crossing the first direction. The method also includes disposing an upper-layer pattern comprising a third pattern having the first pitch and at least partially overlapping with the lower-layer pattern over the lower-layer pattern. The method further includes generating a first reflected first order diffraction light associated with the first pitch from the lower-layer pattern at a first angle with a perpendicular plane to the substrate and a second reflected first order diffraction light associated with the third pattern at the first angle with a perpendicular plane to the substrate. The method includes generating a third reflected first order diffraction light associated with the second pitch from the lower-layer pattern at a third angle with the perpendicular plane to the substrate, wherein the third angle is between 2 to 4 times larger than the first angle and determining an overlay error between the lower-layer pattern and the upper-layer pattern based on a combination of the first reflected first order diffraction light and the second reflected first order diffraction light. In an embodiment, the first and second intervals are a same interval along the first direction. The first pitch is at least 3 times the second pitch, and at least three second sub-patterns are distributed between each two neighboring first sub-patterns. In an embodiment, the method further includes detecting, by a detector, the combination of the first reflected first order diffraction light and the second reflected first order diffraction light and blocking the third reflected first order diffraction light from the detector. In an embodiment, an aperture of the detector has a numerical aperture that blocks the third reflected first order diffraction light. In an embodiment, the method further includes irradiating, with a coherent beam of light, the partial overlap of the upper-layer pattern and the lower-layer pattern to generate the first reflected first order diffraction light, the second reflected first order diffraction light, and the third reflected first order diffraction light. In an embodiment, the method further includes detecting a first signal, by one or more detectors, based on a combination of a first reflected negative first order diffraction light and a second reflected negative first order diffraction light, detecting a second signal, by the one or more detectors, based on a combination of the first reflected positive first order diffraction light and the second reflected positive first order diffraction light, combining the first signal and the second signal, and determining the overlay error between the lower-layer pattern and the upper-layer pattern based on the combination of the first signal and the second signal. In an embodiment, the method further includes generating the coherent beam of light by a laser light source.

According to some embodiments of the present disclosure, an overlay error measurement structure includes a lower-layer pattern disposed over a substrate and an upper-layer pattern disposed over the lower-layer pattern and at least partially overlapping with the lower-layer pattern. The lower-layer pattern includes two non-overlapping patterns, a first pattern having a plurality of first sub-patterns extending in a first length along a first direction and being arranged with a first pitch in a second direction crossing the first direction and a second pattern having a plurality of second sub-patterns extending in a second length along the first direction and being arranged with a second pitch in the second direction crossing the first direction. The second sub-patterns are disposed interleaved between the first sub-patterns, and the second pitch is smaller than the first pitch to separate a first reflected first order diffractions from the first pitch of the lower-layer pattern from a second reflected first order diffractions from the second pitch of the lower-layer pattern when the first and second reflected first order diffractions leave the substrate. The upper-layer pattern includes a third pattern having a plurality of third sub-patterns extending in the first direction and being arranged with the first pitch in the second direction. In an embodiment, the first reflected first order diffractions from the first pitch of the lower-layer pattern is produces a first angle with a perpendicular plane to the substrate and the second reflected first order diffractions from the second pitch of the lower-layer pattern makes a second angle with the perpendicular plane to the substrate. The second angle is at least twice the first angle. In an embodiment, the first pitch is between 2 to 10 times the second pitch and between 2 to 10 second sub-patterns are distributed in a first interval along the second direction between each two neighboring first sub-patterns, and in each first interval one of the second sub-patterns is connected from either left or right of the second sub-pattern to a first sub-pattern. In an embodiment, the upper-layer pattern is disposed as a photo resist pattern. In an embodiment, each of first sub-patterns and each of the second sub-patterns have a same width. In an embodiment, the first and second directions are perpendicular to each other.

According to some embodiments of the present disclosure, a method of overlay error measurement for manufacturing a semiconductor device includes disposing a lower-layer pattern over a substrate of a semiconductor device that includes disposing a first pattern having a first plurality of first sub-patterns extending in a first interval along a first direction and being arranged with a first pitch in a second direction crossing the first direction, and disposing a second pattern having a second plurality of second sub-patterns extending in a second interval along the first direction and being arranged with a second pitch, smaller than the first pitch, in the second direction crossing the first direction. The second sub-patterns are disposed interleaved between the first sub-patterns. The method includes blocking reflected first order diffracted light associated with the second pitch from the lower-layer pattern. The method also includes disposing an upper-layer pattern including a third pattern having the first pitch and at least partially overlapping with the lower-layer pattern over the lower-layer pattern. The method further includes determining an overlay error between the lower-layer pattern and the upper-layer pattern based on a combination of reflected first order diffracted light from the upper-layer pattern and reflected first order diffracted light associated with the first pitch from the lower-layer pattern. In an embodiment, the first sub-patterns and the second sub-patterns of the lower-layer pattern produce an average distance between structures of the lower-layer pattern that is within a fifty percent range of a critical dimension (CD) of the semiconductor device. In an embodiment, the first interval and the second interval are same intervals and the first sub-patterns and the second sub-patterns are extended in parallel. In an embodiment, the determining the overlay error includes applying a beam of light over a partial overlap of the upper-layer pattern and the lower-layer pattern, and analyzing the combination of diffracted light from the upper-layer pattern and diffracted light associated with the first pitch from the lower-layer pattern. In an embodiment, the analyzing the combination of diffracted light includes determining an intensity difference between a combination of positive first order diffracted light and a combination of negative first order diffracted light. In an embodiment, the method includes the applying the beam of light further includes irradiating, with a coherent beam of light a partial overlap of the upper-layer pattern and the lower-layer pattern. In an embodiment, the method includes placing the substrate on a stage, and controlling a movement of the substrate under the coherent beam of light by a stage controller, wherein the coherent beam of light irradiates the partial overlap of the upper-layer pattern and the lower-layer pattern.

The semiconductor manufacturing process steps are designed to avoid affecting the CD of the layout pattern of a layer. Because the pitch of the overlay measurement pattern of the layer is much larger than the CD, by adding extra sub-patterns, the pitch of the overlay measurement pattern changes and becomes comparable to the CD without affecting the original overlay measurement pattern. Thus, the overlay measurement pattern may not be affected by the subsequent process steps.

In some embodiments, the gate patterns (gate electrodes) have dimensions of less than 50 nm. When fine patterns of less than 50 nm are formed by an etching operation, the etching conditions are adjusted for the fine patterns. However, the adjusted etching conditions may not necessarily be suitable for large pattern including the overlay measurement patterns and, thus, may cause pattern asymmetry or other deformation in the overlay patterns, which in turn may affect the overlay measurement accuracy. In the above embodiments, the lower overlay measurement patterns have the same as or similar pitch size to the dimension, e.g., critical dimension, of the fine patterns and, thus, the overlay measurement patterns can be made as a symmetric pattern. Although additional patterns to make the lower overlay measurement patterns to have the same dimension/pitches are added, the diffracted light from the additional patterns can be removed by a pupil filter (aperture).

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   disposing a first pattern over a substrate, the first pattern having a plurality of first sub-patterns extending in a first interval along a first direction and being arranged with a first pitch in a second direction crossing the first direction; and
   disposing a second pattern over the substrate having a plurality of second sub-patterns disposed among the first sub-patterns and extending in a second interval along the first direction and being arranged with a second pitch different from the first pitch, in the second direction crossing the first direction;
   disposing a third pattern over the first pattern, the third pattern having the first pitch and at least partially overlapping with the first pattern;
   generating a first diffraction light associated with the first pitch at a first angle and a second diffraction light associated with the third pattern at the first angle;
   generating a third diffraction light associated with the second pitch at a second angle, wherein the second angle is between 2 to 4 times larger than the first angle; and
   determining an overlay error between the first pattern and the third pattern based on the first diffraction light and the second diffraction light.

2. The method of claim 1, wherein the first pitch is at least 3 times the second pitch, and wherein at least three second sub-patterns are distributed between each two neighboring first sub-patterns.

3. The method of claim 1, further comprising:
   detecting, by a detector, a combination of the first diffraction light and the second diffraction light; and
   blocking the third diffraction light from the detector.

4. The method of claim 3, wherein an aperture of the detector has a numerical aperture that blocks the third diffraction light.

5. The method of claim 3, further comprising:
   irradiating, with a coherent beam of light, at least a partial overlap of the third pattern and the first pattern to generate the first diffraction light, the second diffraction light, and the third diffraction light.

6. The method of claim 5, further comprising:
   generating the coherent beam of light by a laser light source.

7. The method of claim 1, further comprising:
   detecting a first signal, by one or more detectors, based on a combination of a first negative diffraction light and a second negative diffraction light;
   detecting a second signal, by the one or more detectors, based on a combination of a first positive diffraction light and a second positive diffraction light;
   combining the first signal and the second signal; and
   determining the overlay error between the first pattern and the third pattern based on the combination of the first signal and the second signal.

8. An overlay error measurement structure, comprising:
   a first pattern disposed over a substrate; and
   a second pattern disposed over the first pattern and at least partially overlapping with the first pattern, wherein:

the first pattern comprises a plurality of first sub-patterns extending in a first length along a first direction and being arranged with a first pitch in a second direction crossing the first direction and a plurality of second sub-patterns extending in a second length along the first direction and being arranged with a second pitch in the second direction crossing the first direction, wherein the second sub-patterns are disposed among the first sub-patterns, and wherein the second pitch is smaller than the first pitch to separate a first reflected light from the first pitch from a second reflected light from the second pitch; and the second pattern comprises a plurality of third sub-patterns extending in the first direction and being arranged with the first pitch in the second direction.

9. The overlay error measurement structure of claim 8, wherein the first reflected light from the first pitch of the first pattern is configured to produce a first angle with a perpendicular plane to the substrate and the second reflected light from the second pitch of the first pattern is configured to make a second angle with the perpendicular plane to the substrate, and wherein the second angle is at least twice the first angle.

10. The overlay error measurement structure of claim 8, wherein the first pitch is between 2 to 10 times the second pitch, wherein between 2 to 10 second sub-patterns are distributed in a first interval along the second direction between each two neighboring first sub-patterns, and wherein in each first interval one of the second sub-patterns is connected from either left or right of the second sub-pattern to a first sub-pattern.

11. The overlay error measurement structure of claim 8, wherein the second pattern is disposed as a photo resist pattern.

12. The overlay error measurement structure of claim 8, wherein each of first sub-patterns and each of the second sub-patterns have a same width.

13. The overlay error measurement structure of claim 8, wherein the first and second directions are perpendicular to each other.

14. A method comprising:
forming a first pattern having a plurality of first sub-patterns extending in a first interval along a first direction and being arranged with a first pitch in a second direction crossing the first direction; and
forming a second pattern having a plurality of second sub-patterns extending in a second interval along the first direction and being arranged with a second pitch, smaller than the first pitch, in the second direction crossing the first direction, wherein the second sub-patterns are disposed among the first sub-patterns; and
blocking a reflected first light associated with the second pitch from the second pattern;
forming a third pattern over the first pattern, the third pattern having the first pitch and at least partially overlapping with the first pattern; and
determining an overlay error between the first pattern and the third pattern based on diffracted light from the third pattern and diffracted light associated with the first pitch from the first pattern.

15. The method of claim 14, wherein the first sub-patterns and the second sub-patterns produce an average distance between structures of the first and second patterns that is within a fifty percent range of a critical dimension (CD) of a semiconductor device.

16. The method of claim 14, wherein the first interval and the second interval are same intervals and the first sub-patterns and the second sub-patterns are extended in parallel.

17. The method of claim 14, wherein the determining the overlay error comprises:
applying a beam of light over a partial overlap of third pattern and the first pattern; and
analyzing a combination of diffracted light from the third pattern and diffracted light associated with the first pitch from the first pattern.

18. The method of claim 17, wherein the analyzing the combination of diffracted light comprises determining an intensity difference between a combination of positive first order diffracted light and a combination of negative first order diffracted light.

19. The method of claim 17, wherein the applying the beam of light further comprises:
irradiating, with a coherent beam of light a partial overlap of the third pattern and the first pattern.

20. The method of claim 19, further comprising:
forming the first and second patterns over a substrate of a semiconductor device;
placing substrate on a stage; and
controlling a movement of the substrate under the coherent beam of light by a stage controller, wherein the coherent beam of light irradiates the partial overlap of the third pattern and the first pattern.

* * * * *